United States Patent
Sukegawa et al.

(10) Patent No.: US 7,345,003 B2
(45) Date of Patent: Mar. 18, 2008

(54) SEMICONDUCTOR DEVICE MANUFACTURING METHOD, WAFER, AND WAFER MANUFACTURING METHOD

(75) Inventors: Takae Sukegawa, Kawasaki (JP); Ryou Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 384 days.

(21) Appl. No.: 11/120,981

(22) Filed: May 4, 2005

(65) Prior Publication Data

US 2006/0141801 A1 Jun. 29, 2006

(30) Foreign Application Priority Data

Dec. 24, 2004 (JP) ............................. 2004-374317

(51) Int. Cl.
*H01L 21/26* (2006.01)

(52) U.S. Cl. ................ 438/795; 438/708; 257/E21.324

(58) Field of Classification Search ...................... None
See application file for complete search history.

(56) References Cited

U.S. PATENT DOCUMENTS

2004/0077134 A1* 4/2004 Takayama et al. .......... 438/151

FOREIGN PATENT DOCUMENTS

| JP | 60-732 | 1/1985 |
|---|---|---|
| JP | 9-246202 | 9/1997 |

* cited by examiner

*Primary Examiner*—Michael Lebentritt
*Assistant Examiner*—Kyoung Lee
(74) *Attorney, Agent, or Firm*—Westerman, Hattori, Daniels & Adrian, LLP.

(57) ABSTRACT

A semiconductor device manufacturing method capable of making in-plane temperature distribution on a wafer uniform at heat treatment time. Before heat treatment is performed by irradiating the wafer with lamp light from the side of a device formed area where semiconductor devices are to be formed, an SiN film with certain thickness the reflection factor of which is equal to the average reflection factor of the device formed area is formed in an edge portion outside the device formed area. By doing so, reflection factors on the surface of the wafer irradiated with lamp light can be made uniform and uniform temperature distribution on the wafer can be obtained at heat treatment time. As a result, in-plane variations in the characteristics of semiconductor devices on the wafer can be made small and high-quality semiconductor devices can be manufactured.

16 Claims, 24 Drawing Sheets

SEMICONDUCTOR DEVICE MANUFACTURING METHOD, WAFER, AND WAFER MANUFACTURING METHOD

CROSS-REFERENCE TO RELATED APPLICATIONS

This application is based upon and claims the benefits of priority from the prior Japanese Patent Application No. 2004-374317, filed on Dec. 24, 2004, the entire contents of which are incorporated herein by reference.

BACKGROUND OF THE INVENTION (1) Field of the Invention

This invention relates to a semiconductor device manufacturing method, wafer, and wafer manufacturing method and, more particularly, to a semiconductor device manufacturing method in which heat treatment is performed in the process of manufacturing semiconductor devices, a wafer on which such heat treatment is performed, and a method for manufacturing such a wafer.

(2) Description of the Related Art

To manufacture semiconductor devices, heat treatment, such as a spike anneal which needs a rapid increase and decrease in temperature, is currently performed on wafers. In this case, lamp annealers in which heat treatment is performed by irradiating a wafer with light emitted from a lamp (lamp light) are widely used.

Heat treatment is performed on a wafer with such a lamp annealer in the following way. First, a silicon (Si) wafer, for example, of predetermined size is placed on a ring-like substrate holder of predetermined size located in the chamber of the lamp annealer so that it will be supported by the edge portion. Then heat treatment is performed by irradiating a predetermined surface of the wafer placed in this way with lamp light.

With currently used lamp annealers, an area irradiated with lamp light is divided into a plurality of zones and each zone is irradiated with lamp light of proper intensity. Temperatures at a plurality of points on a wafer are monitored and are reflected in the intensity of lamp light with which each zone is irradiated. To make in-plane temperature distribution on the wafer as uniform as possible, a currently used lamp annealer irradiates each zone with lamp light of proper intensity, while adjusting the balance of the intensity of lamp light with which the plurality of zones are irradiated.

With lamp annealers, the temperature of a wafer is increased and decreased by lamp light. Conventionally, techniques for adjusting the reflection factor of a wafer irradiated with lamp light have been proposed in order to make in-plane temperature distribution on the wafer uniform. For example, the reflection factors of surfaces irradiated directly with lamp light differ among different wafers, so ultimate temperatures also differ among them. In order to solve this problem, a technique for making the reflection factor of a surface of each wafer irradiated with lamp light constant or for controlling the roughness, for example, of a surface of a wafer irradiated with lamp light in such a way that the reflection factor of the surface becomes lower with distance from the center is proposed (see Japanese Unexamined Patent Publication No. 9-246202). In addition, to prevent a slip line from appearing at the time of heating for a long time, a technique for working a wafer in such a way that a reflection factor in the central portion differs from a reflection factor in the edge portion is proposed (see Japanese Unexamined Patent Publication No. 60-732).

However, the following problems arise about the conventional method for performing heat treatment with a lamp annealer.

When semiconductor devices are manufactured, usually patterns for the semiconductor devices (which may not be complete) are formed on a wafer except the edge portion. If device patterns are formed in the edge portion by using a resist, the possibility that particles are produced in the edge portion in the process of manufacture gets greater. To prevent such particles from being produced, exposure is currently performed on the edge portion (area with a width from the edge of about 1 to 2 mm) of the wafer to remove the resist therein before predetermined device patterns are formed. This operation is repeated from the early stages to prevent the device patterns from being formed in the edge portion of the wafer. Accordingly, after many processes are performed, device patterns are formed on the wafer except the edge portion and an Si surface gets exposed in the edge portion.

The wafer where the device patterns are formed in this way is referred to as a device wafer. There are polycrystalline silicon used mainly as gate electrodes and silicon oxide used as isolation areas and the like in an area (device formed area) on this wafer where the device patterns are formed. As described above, the Si surface is in an exposed state in the edge portion outside the device formed area. The average reflection factor of the device formed area including polycrystalline silicon and silicon oxide is different from the reflection factor of the edge portion where the Si surface is in an exposed state.

It is assumed that the average reflection factor of the device formed area is lower than the reflection factor of the edge portion where the Si surface is in an exposed state. When heat treatment is performed on the device wafer with the intensity of lamp light in the lamp annealer uniform to increase and decrease the temperature of the wafer, the temperature of the edge portion is likely to be lower than that of the device formed area due to the difference in reflection factor. This may lead to a difference in final characteristic between a semiconductor device obtained from the central portion of the device wafer and a semiconductor device obtained from a portion near the edge portion of the device wafer because their thermal budgets are different from each other.

As described above, with the currently used lamp annealers each zone is irradiated with lamp light. Temperatures monitored at a plurality of points on a wafer are reflected in the intensity of lamp light with which each of zones from the center to the edge portion is irradiated. The currently used lamp annealers include lamps for directly irradiating the edge portion of a wafer and substrate holders with light. With the currently used lamp annealers, however, the temperature of substrate holders is not monitored to reflect it in the intensity of lamp light. Therefore, in the currently used lamp annealers, temperatures monitored in a device formed area near the edge portion on a wafer are reflected in the intensity of lamp light with which the edge portion and the substrate holders are irradiated. However, if the temperature of the edge portion the reflection factor of which is high and the temperature of which is difficult to raise is controlled on the basis of the temperature of the device formed area the reflection factor of which is low and the temperature of which is easy to raise, the amount of control is small and the temperature of the edge portion becomes relatively low. Accordingly, it is difficult to keep in-plane temperature distribution on the wafer uniform.

Moreover, in a lamp annealer, a substrate holder for supporting a device wafer by the edge portion is usually made from a material which is superior to the device wafer in heat resistance and its reflection factor and heat capacity are higher than those of the device wafer. Accordingly, even if each zone is irradiated with lamplight, the temperature of the edge portion of the device wafer is influenced by the temperature of the substrate holder. As a result, the temperature of the edge portion of the device wafer becomes lower than that of a device formed area and it is impossible to keep in-plane temperature distribution on the device wafer uniform.

In-plane temperature distribution on a wafer can be optimized by reflecting monitored temperatures in the intensity of lamp light and by adding an offset value to the intensity of lamp light. Conventionally, such an offset value has been calculated by using a bare wafer. That is to say, a bare wafer is treated in advance in a lamp annealer where a device wafer is to be treated. An optimum offset value to be added to the intensity of lamp light with which each zone is irradiated at the time of the device wafer being treated is set in advance on the basis of in-plane temperature distribution obtained at this time. However, the reflection factor of the bare wafer is the same as that of an exposed Si surface on the device wafer and is different from the average reflection factor of a device formed area. Therefore, if the offset value set on the basis of the bare wafer is used, the ultimate temperature of the device formed area at lamp anneal time will not be a proper value.

As described above, with the conventional method for performing heat treatment with a lamp annealer, it is difficult to make the temperatures of a device formed area and an edge portion having different reflection factors equal.

SUMMARY OF THE INVENTION

The present invention was made under the background circumstances described above. An object of the present invention is to provide a semiconductor device manufacturing method by which a uniform temperature distribution is obtained at the time of performing heat treatment on a wafer.

Another object of the present invention is to provide a wafer used for performing heat treatment by which a uniform temperature distribution is obtained and a wafer manufacturing method for manufacturing such a wafer.

In order to achieve the above-mentioned object, a semiconductor device manufacturing method including the process of performing heat treatment by light irradiation is provided. In this semiconductor device manufacturing method, a film formed wafer where a film having the same reflection factor as a device formed area on a device wafer in which semiconductor devices are to be formed is formed in a specific area on a surface directly irradiated with light is used when heat treatment is performed by irradiating the device formed area on the device wafer with the light.

In order to achieve the above-mentioned object, a wafer used for heat treatment performed by light irradiation is provided. A film having the same reflection factor as a device formed area where semiconductor devices are to be formed is formed in a specific area on a surface of this wafer directly irradiated with light.

In addition, in order to achieve the above-mentioned object, a wafer manufacturing method for manufacturing a wafer used for heat treatment in which light irradiation is performed is provided. This wafer manufacturing method comprises the steps of forming a film with the same reflection factor as a device formed area where semiconductor devices are to be formed on the entire surface of the device formed area; forming a photoresist which covers an edge portion; and removing the film formed on the device formed area by performing etching with the photoresist as a mask.

Furthermore, in order to achieve the above-mentioned object, a wafer manufacturing method for manufacturing a wafer used for heat treatment in which light irradiation is performed is provided. In this wafer manufacturing method, after a film with the same reflection factor as a device formed area where semiconductor devices are to be formed is formed on all sides, the film formed on one side and the film formed on an edge portion on the other side are removed.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

An overview of a lamp annealer will be given first.

Figure 1:
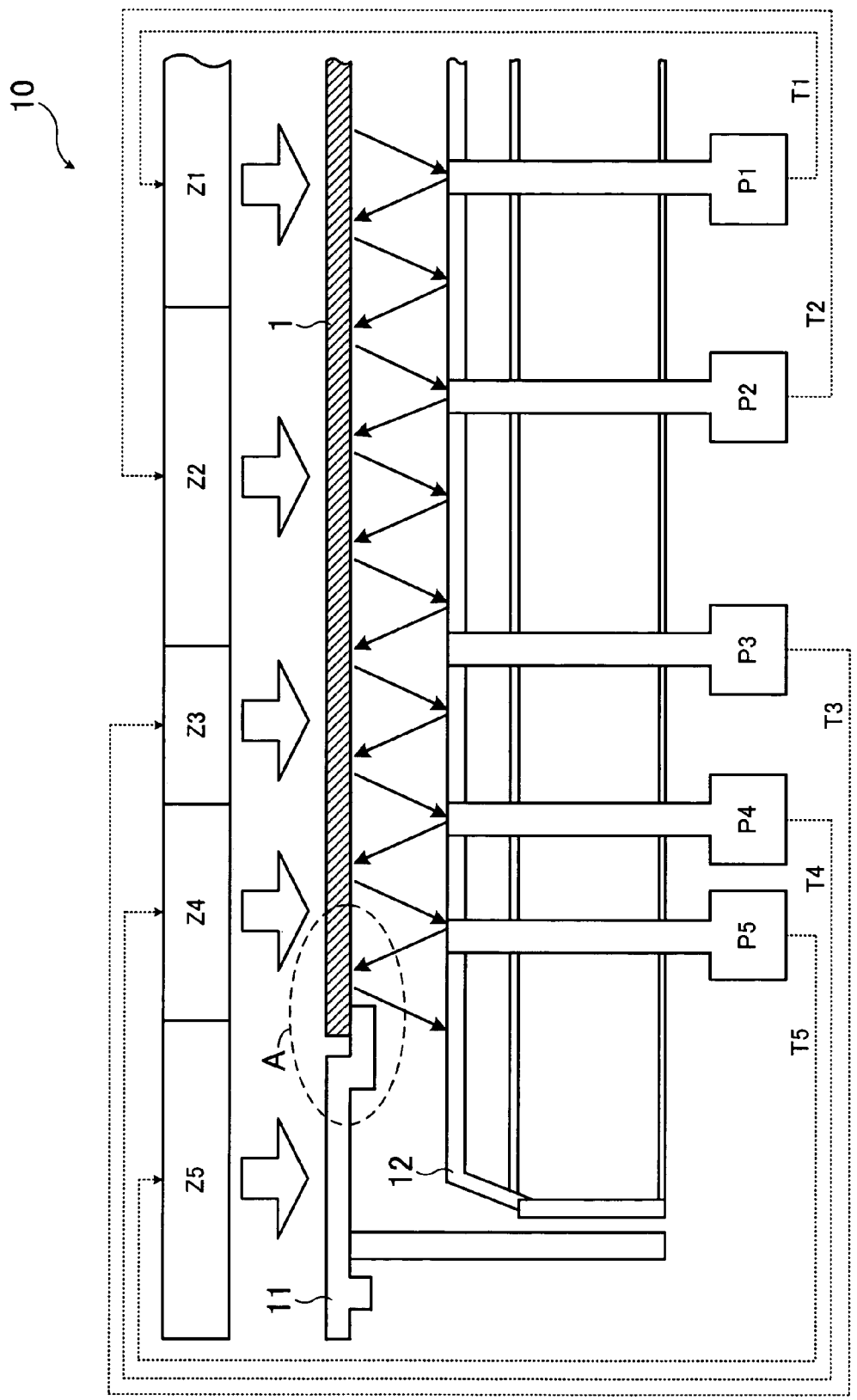
FIG. 1 is a simplified sectional view showing the main portion of an example of a lamp annealer.
Figure 2:
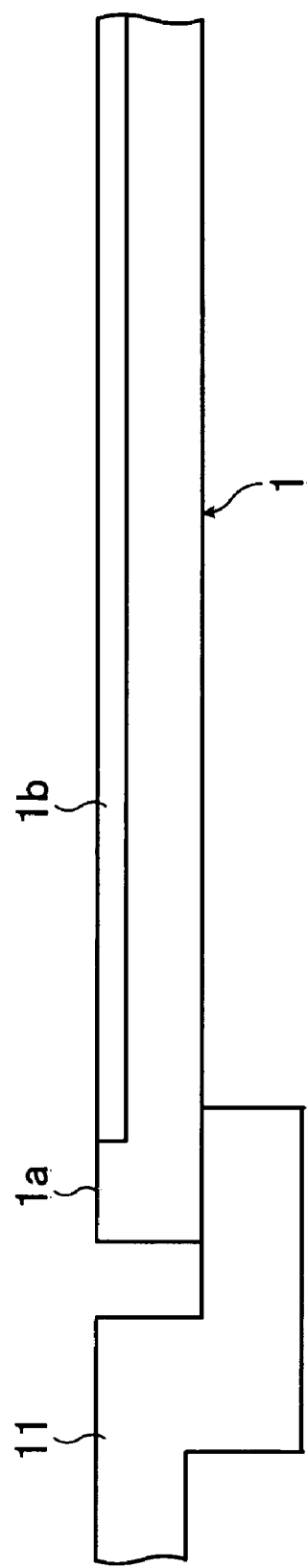
FIG. 2 is an enlarged view of the portion A shown in FIG. 1.

FIG. 1 is a simplified sectional view showing the main portion of an example of a lamp annealer. FIG. 2 is an enlarged view of the portion A shown in FIG. 1. In FIG. 1, half of an area in a chamber of a lamp annealer is shown.

In a chamber of a lamp annealer 10 shown in FIG. 1, a substrate holder 11 on which various wafers, such as a device wafer 1, are placed for performing a lamp anneal is located. The substrate holder 11 supports a wafer by the edge portion. In addition, the lamp annealer 10 includes lamp zones Z1 through Z5 located on one side of the wafer supported by the substrate holder 11 and a reflecting plate 12 located on the other side of the wafer. The lamp annealer 10 performs heat treatment not only by directly irradiating one side of the wafer supported by the substrate holder 11 with lamp light (shown by thick arrows) but also by making the reflecting plate 12 located on the other side of the wafer reflect radiant light (shown by thin arrows) from the wafer onto the wafer. Five radiant light detecting sensors P1 through P5 for detecting radiant light from the wafer reflected multiply from the wafer and the reflecting plate 12 are located on the other side of the wafer.

As shown in FIG. 2, an Si surface is exposed in an edge portion 1a on one side of, for example, the device wafer 1 with a width from the edge of about 1 to 2 mm. Various device patterns for semiconductor devices (which may not be complete) are formed in a device formed area 1b which is inside the edge portion 1a. A large portion of the device formed area 1b is occupied by polycrystalline silicon used as gate electrodes and silicon oxide embedded in shallow trench isolation (STI) areas. The average reflection factor of the device formed area 1b depends mainly on, for example, the height of the gate electrodes and the depth of the STI areas and is usually lower than the reflection factor of the exposed Si surface in the edge portion 1a. In the lamp annealer 10, the device formed area 1b of the device wafer 1 having the edge portion 1a and the device formed area 1b is faced to the side of the lamp zones Z1 through Z5 and the edge portion 1a is supported by the substrate holder 11 from the reverse side.

Each of the lamp zones Z1 through Z5 includes a lamp for irradiating the device wafer 1 supported by the substrate holder 11 with lamp light. The lamp zone Z1 is located so that it will irradiate approximately the central portion of the device wafer 1 directly with lamp light. The lamp zones Z2, Z3, and Z4 are located in that order in the direction from the central portion to the edge of the device wafer 1 so that they will irradiate predetermined areas on the device wafer 1 directly with lamp light. The lamp zone Z5 is located so that it will irradiate the edge portion 1a on the device wafer 1 and an area on the substrate holder 11 directly with lamp light.

The radiant light detecting sensors P1 through P5 are located so that they will monitor temperatures at points on the surface of the reflecting plate 12 corresponding to positions in the device formed area 1b each of which is a specific distance away from the center (0 mm) of the device wafer 1. Temperatures T1 through T5 detected by the radiant light detecting sensors P1 through P5 are reflected in the intensity of lamp light emitted from the lamp zones Z1 through Z5 respectively. As described above, in the lamp annealer 10 the temperature T5 at a portion in the device formed area 1b which is nearest to the edge portion 1a is fed back to the lamp zone Z5 which irradiates the edge portion 1a on the device wafer 1 directly with lamp light.

Usually the average reflection factor of the device formed area 1b is lower than the reflection factor of the exposed Si surface in the edge portion 1a. Therefore, if a lamp anneal is performed on the device wafer 1 by using the lamp annealer 10 having the above-mentioned structure, the temperature of the device formed area 1b is easy to increase and the temperature of the edge portion 1a is difficult to increase. As a result, even if the temperature T5 at the portion in the device formed area 1b detected by the radiant light detecting sensor P5 is fed back to the lamp zone Z5, the amount of control is too small to increase the temperature of the edge portion 1a and the substrate holder 11. Temperature control cannot be performed properly. This means that at lamp anneal time the temperature of the edge portion 1a and the substrate holder 11 will be set to a lower value than is originally needed.

In-plane temperature distribution on a wafer obtained when heat treatment is performed by using the lamp annealer 10 will now be described in more detail.

Figure 3:
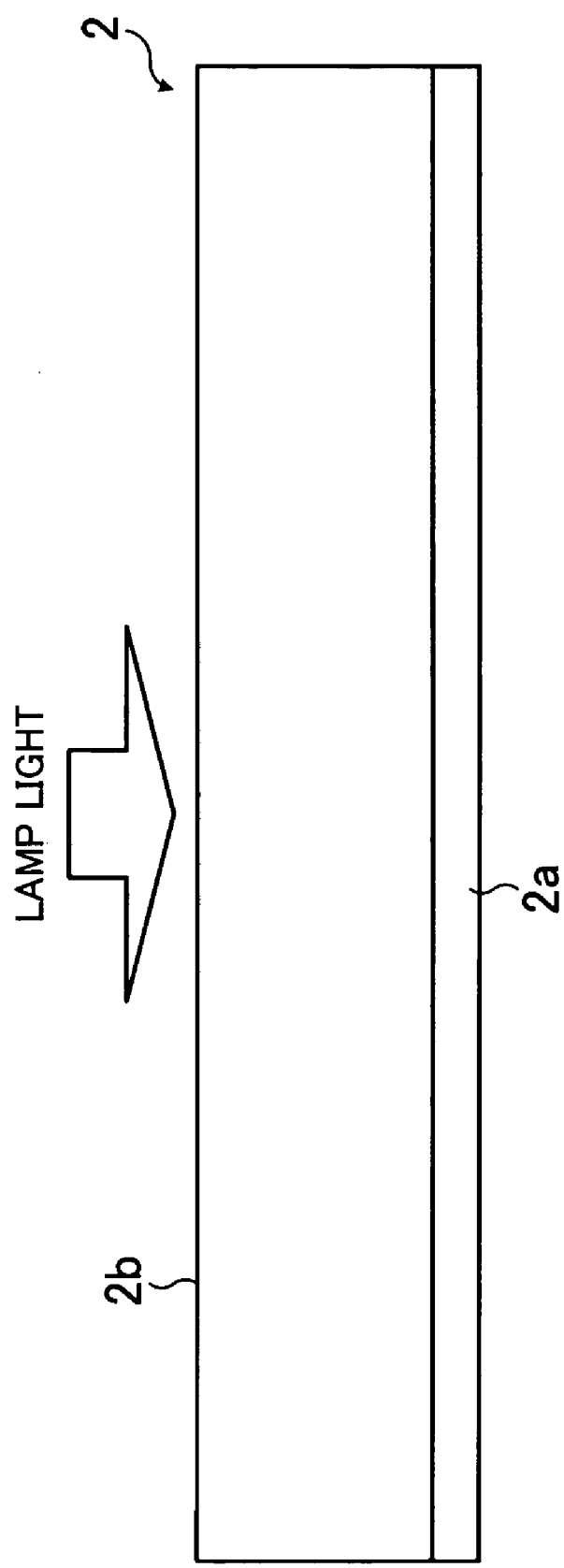
FIG. 3 is a simplified sectional view showing an example of a bare wafer.
Figure 4:
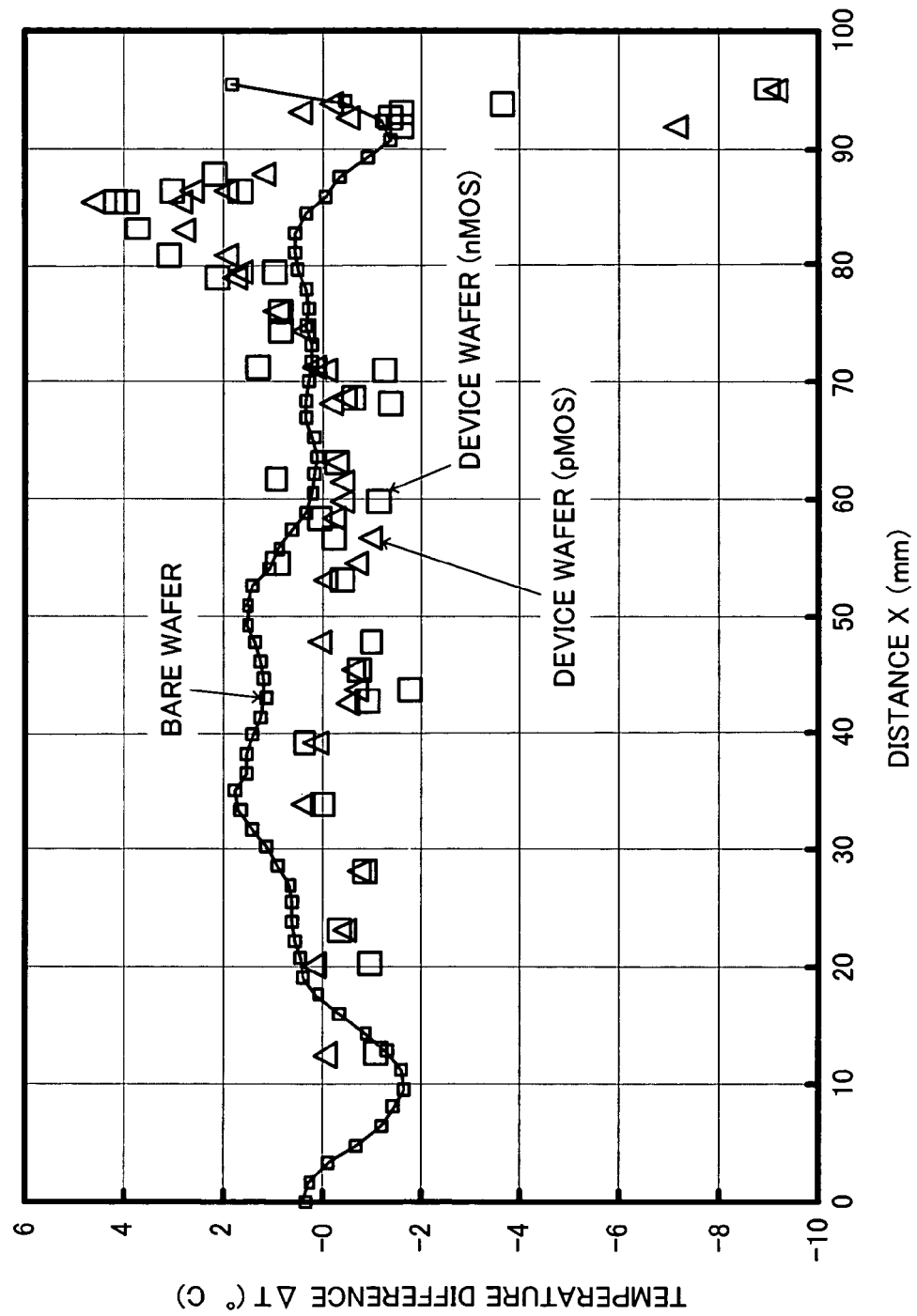
FIG. 4 shows examples of in-plane temperature distribution on a bare wafer and device wafers.

FIG. 3 is a simplified sectional view showing an example of a bare wafer. FIG. 4 shows examples of in-plane temperature distribution on a bare wafer and device wafers. In FIG. 4, a horizontal axis indicates distance X (mm) between each position on a wafer and its center (0 mm) and a vertical axis indicates difference $\Delta T$ (° C.) between a set temperature and a temperature at each position.

On one side of a bare wafer 2 shown in FIG. 3, p-type impurities, such as boron fluoride ions ($BF_2^+$), are implanted and a p-type impurity layer 2a is formed. At lamp anneal time, the bare wafer 2 is placed on the substrate holder 11 in the lamp annealer 10 and is supported by the edge portion so that an exposed Si surface 2b on a side of the bare wafer 2 opposite to the side on which the p-type impurity layer 2a is formed will be irradiated directly with lamp light.

In-plane temperature distribution on the bare wafer 2 is shown in FIG. 4. In addition, a lamp anneal is performed on the device wafer 1 shown in FIGS. 1 and 2. FIG. 4 also shows in-plane temperature distribution on the device wafer 1 obtained in this way. A p-type impurity layer is formed on a side of the device wafer 1 opposite to the side on which the device formed area 1b is formed. This is the same with the bare wafer 2 and is not shown in FIGS. 1 and 2. The device wafer 1 is placed in the lamp annealer 10 so that the side on which the device formed area 1b is formed will be irradiated directly with lamp light. In this case, device patterns for pMOSes or nMOSes are formed in the device formed area 1b.

In-plane temperature distribution on the bare wafer 2 and the device wafer 1 is obtained by measuring the in-plane distribution of sheet resistance values on each wafer by the use of implanted p-type impurities after a lamp anneal and estimating temperature distribution at lamp anneal time from these sheet resistance values. To be concrete, lamp anneals are performed first on a plurality of wafers at different anneal temperatures. Sheet resistance values at specific positions on each wafer are measured and the relationship between the anneal temperatures and the sheet resistance values is found. To actually estimate temperatures on the bare wafer 2 and the device wafer 1, temperature sensitivity is found by using the relationship between the anneal temperatures and the sheet resistance values found in advance and the difference ΔT (° C.) between an in-phase average temperature on each wafer and a temperature at each position is found by using the temperature sensitivity. Temperature difference ΔT (° C.) shown by the vertical axis in FIG. 4 indicates the difference between a temperature at each position on each wafer and an in-plane average temperature.

As can be seen from FIG. 4, at lamp anneal time a temperature at each position between the center and the edge portion of the bare wafer 2 is in the range of the set temperature ±2° C. On the other hand, temperatures at positions on the device wafer 1 the distances X from which to the center are about 80 to 90 mm are higher than the set temperature by a maximum of about +4° C. regardless of whether the device patterns for pMOSes or nMOSes are formed. Moreover, temperatures at nearer positions to the edge of the device wafer 1, that is to say, at positions in the device formed area 1*b* the distances X from which to the center of the device wafer 1 are longer than 90 mm are significantly lower than the set temperature.

The exposed Si surface the reflection factor of which is higher than that of the device formed area 1*b* exists in the edge portion 1*a* on the device wafer 1 and the edge portion 1*a* is supported by the substrate holder 11. Accordingly, temperatures at positions in the edge portion 1*a* and near areas to it become lower than the set temperature. As a result, temperatures at positions in areas inside them are on the point of dropping, so a larger amount of control than is originally needed is fedback. However, these areas are in the device formed area 1*b* and the average reflection factor of the device formed area 1*b* is low. Accordingly, temperatures at positions in these areas become higher than the set temperature.

As described above, temperatures at positions in the device formed area 1*b* comparatively near to the edge portion 1*a* are significantly different from temperatures at positions in the device formed area 1*b* inside them and are significantly different from temperatures obtained when the bare wafer 2 is annealed. This means that it is difficult to properly control the temperature of the device wafer 1 by setting an offset value to be used when a lamp anneal is performed on the device wafer 1 by the use of the bare wafer 2 the in-plane reflection factor of which is high and approximately constant.

Therefore, a film formed wafer which is obtained by forming silicon nitride (SiN film) in a specific area on a side of a wafer irradiated with lamp light is used and in-plane temperature distribution is found in the same way. If an SiN film is formed in a specific area on a side of a wafer irradiated with lamp light, this wafer is referred to as a film formed wafer regardless of its type before the formation of the SiN film.

Figure 5:
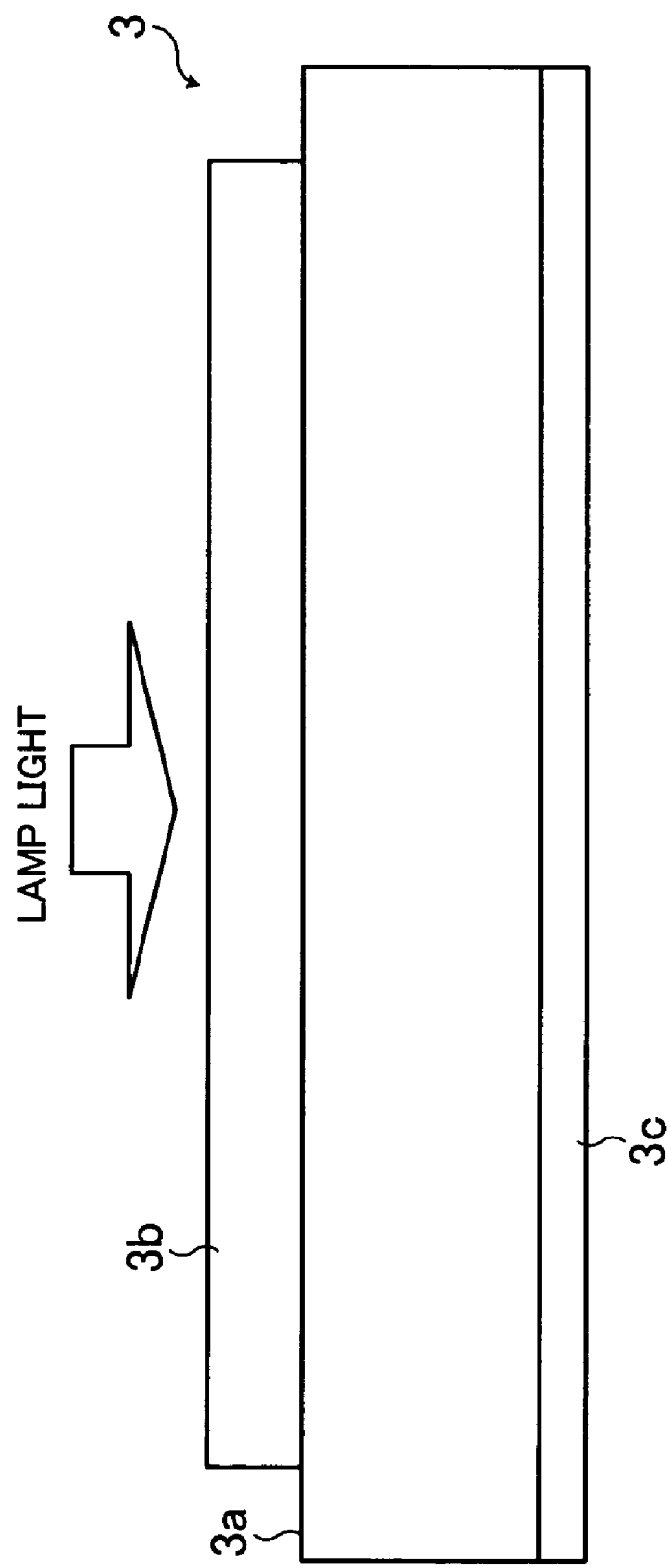
FIG. 5 is a simplified sectional view showing an example of a film formed wafer.
Figure 6:
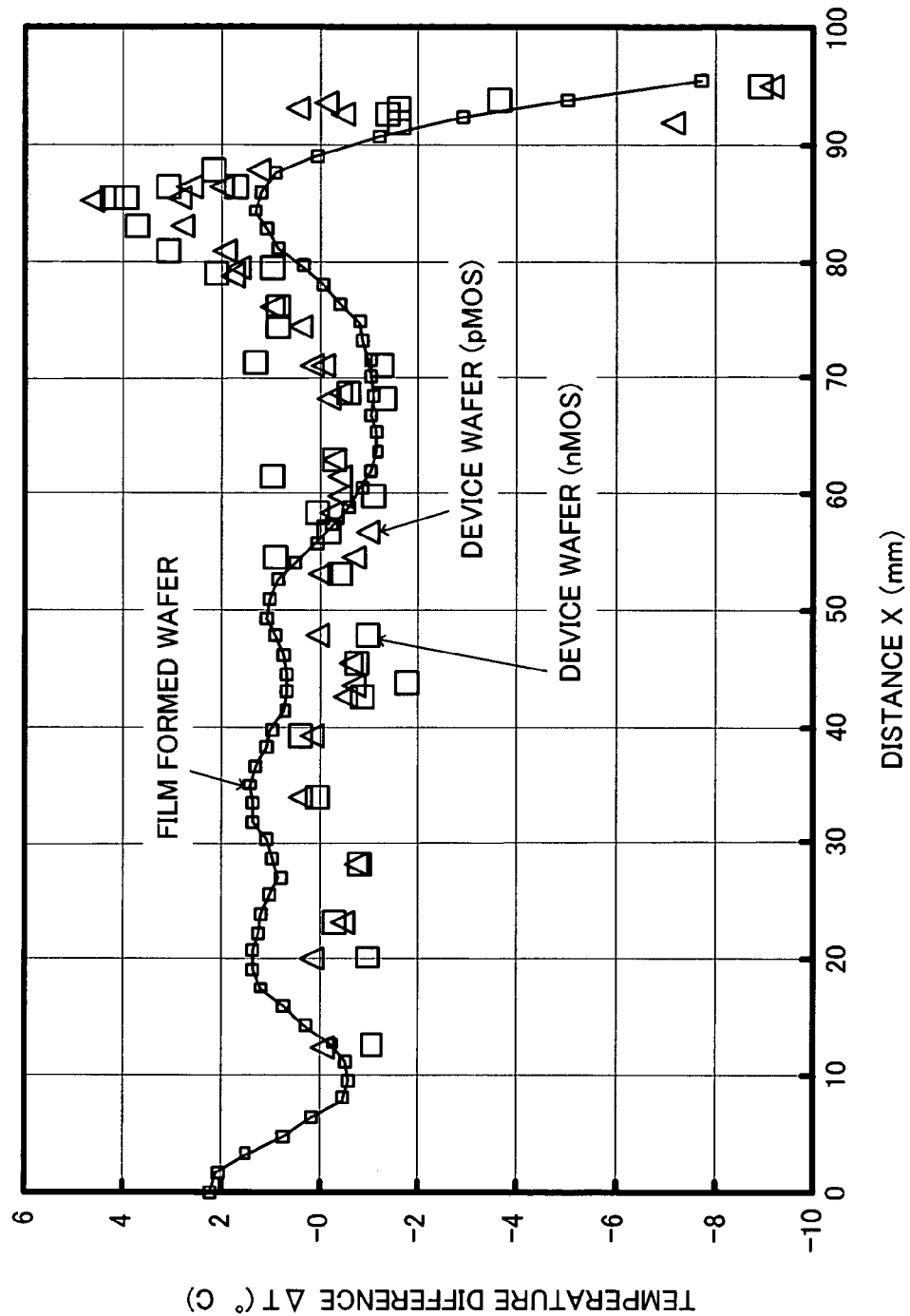
FIG. 6 shows examples of in-plane temperature distribution on a film formed wafer and device wafers.

FIG. 5 is a simplified sectional view showing an example of a film formed wafer. FIG. 6 shows examples of in-plane temperature distribution on a film formed wafer and device wafers. In FIG. 6, a horizontal axis indicates distance X (mm) between each position on a wafer and its center (0 mm) and a vertical axis indicates difference ΔT (° C.) between a set temperature and a temperature at each position. This is the same with FIG. 4.

As shown in FIG. 5, a film formed wafer 3 has an SiN film 3*b* formed on one side except an edge portion 3*a* and a p-type impurity layer 3*c* on the other side. In this example, the SiN film 3*b* with a thickness of about 117 nm is formed by a chemical vapor deposition (CVD) method. The thickness of the SiN film 3*b* is set so that the average reflection factor of the device formed area 1*b* on the device wafer 1 will be equal to the reflection factor of the SiN film 3*b*. In addition, the film formed wafer 3 is placed in the lamp annealer 10 so that the side on which the SiN film 3*b* is formed will be irradiated directly with lamp light.

In-plane temperature distribution on the film formed wafer 3 is shown in FIG. 6. A p-type impurity layer is formed on a side of the device wafer 1 opposite to the side on which the device formed area 1*b* is formed. In-plane temperature distribution obtained when a lamp anneal is performed on this device wafer 1 is also shown in FIG. 6. This is the same with FIG. 4. Device patterns for pMOSes or nMOSes are formed in the device formed area 1*b*. The device wafer 1 is placed in the lamp annealer 10 so that the side on which the device formed area 1*b* is formed will be irradiated directly with lamp light. In-plane temperature distribution on the film formed wafer 3 and the device wafer 1 at lamp anneal time is estimated from sheet resistance values and extension resistance values respectively.

As can be seen from FIG. 6, in-plane temperature distribution on the film formed wafer 3 at lamp anneal time is, on the whole, close to in-plane temperature distribution on the device wafer 1. In particular, the temperature distribution on the film formed wafer 3 is fairly close to the temperature distribution on the device wafer 1 in areas the distances X from which to the center are longer than 80 mm and in which there is a great temperature difference between the bare wafer 2 and the device wafer 1 (see FIG. 4). The reason for this is that the reflection factor of the side of the film formed wafer 3 irradiated with lamp light is equal to that of the side of the device wafer 1 irradiated with lamp light.

Figure 7:
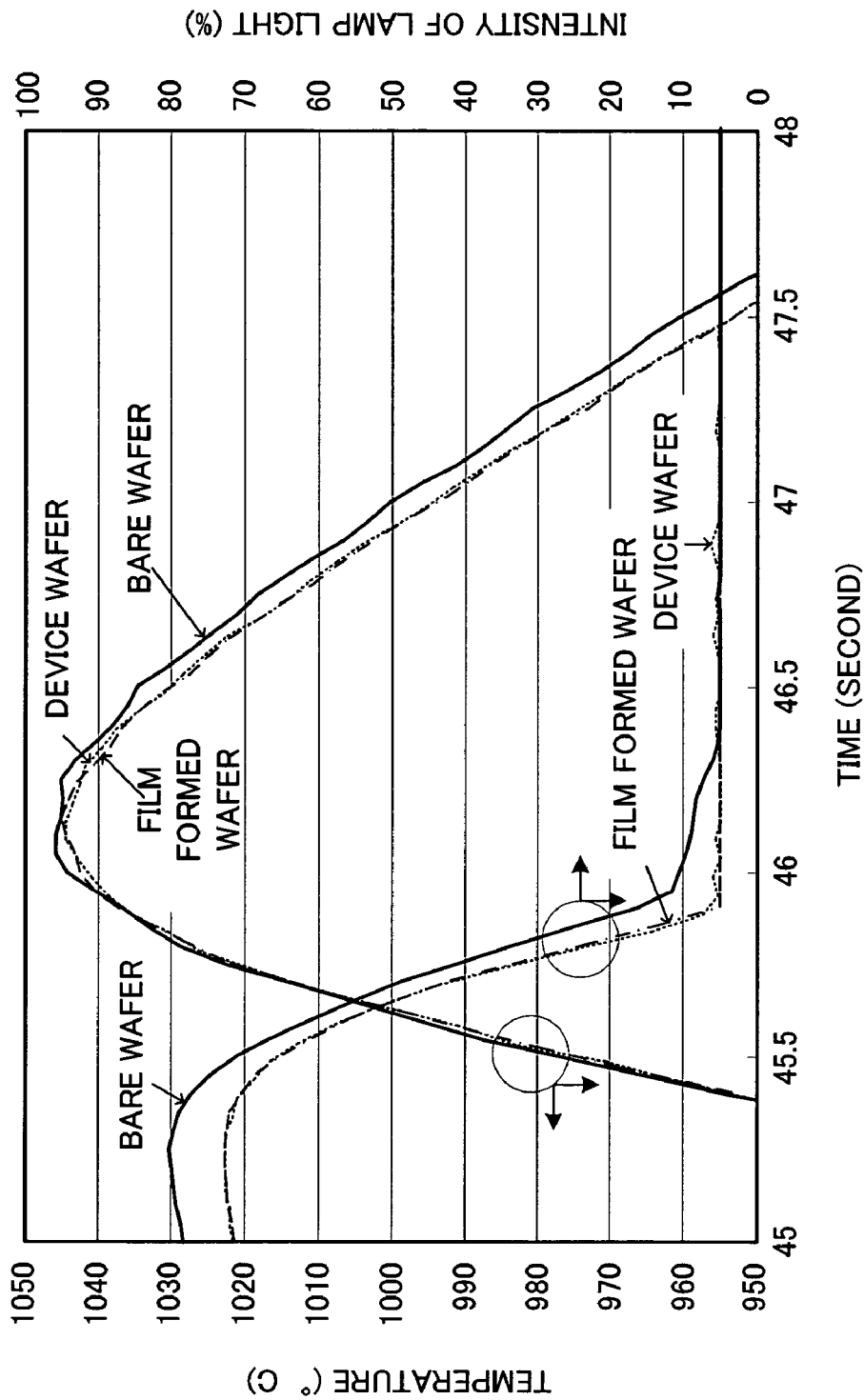
FIG. 7 shows an example of a temperature profile obtained at the time of increasing and decreasing the temperature of each wafer.

FIG. 7 shows examples of temperature profiles obtained at the time of increasing and decreasing the temperature of the device wafer 1, the bare wafer 2, and the film formed wafer 3. In FIG. 7, a horizontal axis indicates time (second) and a vertical axis indicates temperature (° C.) and the intensity of lamp light (%). Each temperature indicated by the vertical axis in FIG. 7 is the average value of the temperatures T1 through T5 detected by the radiant light detecting sensors P1 through P5, respectively, when a process is performed in the lamp annealer 10 shown in FIG. 1 under the condition of the same temperature increase rate. In FIG. 7, a dotted line, a solid line, and a dot-dash line indicate temperature profiles of the device wafer 1, the bare wafer 2, and the film formed wafer 3 respectively.

As can be seen from FIG. 7, the temperature profiles obtained at the time of increasing and decreasing the temperature of the device wafer 1 and the film formed wafer 3 roughly match. The peak temperatures in these temperature profiles roughly match a desired temperature. However, the peak temperature in the temperature profile of the bare wafer 2 is higher than the desired temperature. Moreover, the temperature of the bare wafer 2 at temperature decrease time is higher than that of the device wafer 1 or the film formed wafer 3. As can be seen from profiles of the intensity of lamp light in FIG. 7 obtained at the time of increasing and decreasing the temperature of the device wafer 1, the bare wafer 2, and the film formed wafer 3, the intensity of lamp light for the bare wafer 2 is higher than the intensity of lamp light for the device wafer 1 or the film formed wafer 3.

The reason for this is as follows. The reflection factor of the side of the bare wafer 2 irradiated with lamp light is higher than that of the side of the device wafer 1 or the film formed wafer 3 irradiated with lamp light, so it is difficult to increase the temperature of the bare wafer 2. Accordingly, to increase the temperature of the bare wafer 2 to a set temperature at a predetermined temperature increase rate, the amount of control which makes the intensity of lamp light higher is fed back. As a result, the bare wafer 2 is irradiated with lamp light of higher intensity and the temperature of the bare wafer 2 exceeds the set temperature. This also influences at the time of decreasing the temperature of the bare wafer 2.

Figure 8:
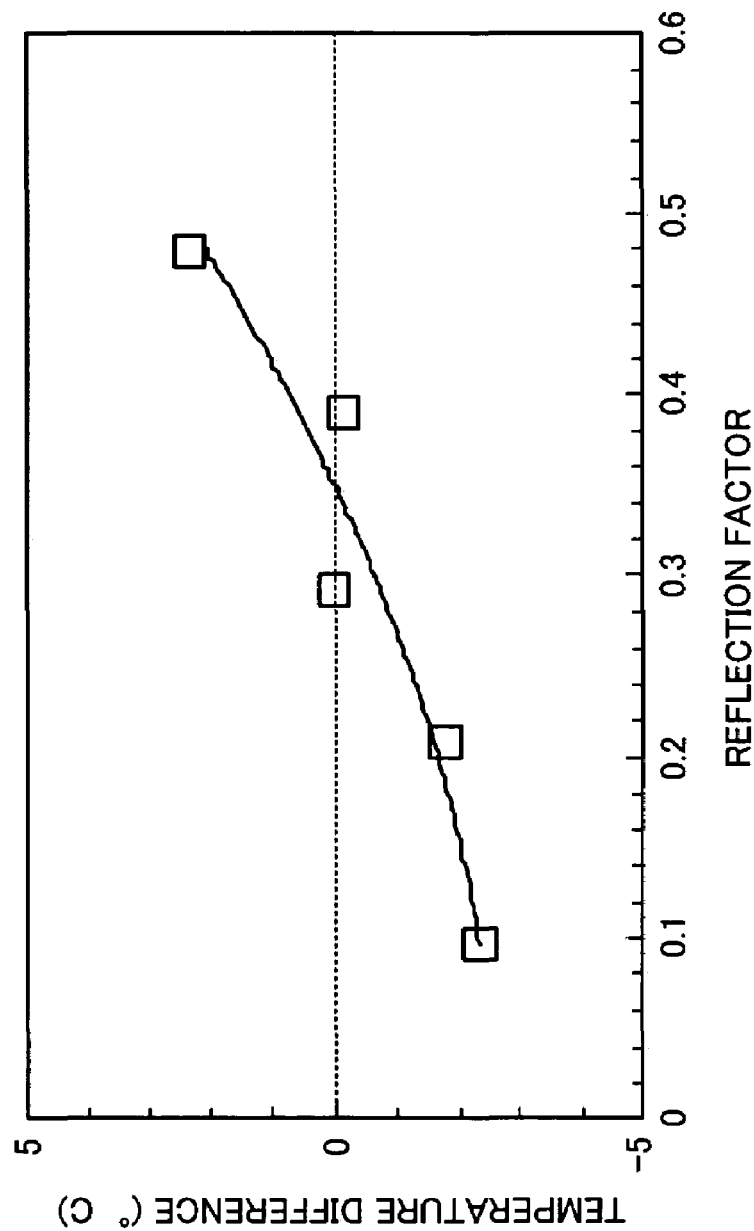
FIG. 8 shows an example of the relationship between the reflection factor and temperature of a wafer.

FIG. 8 shows an example of the relationship between the reflection factor and temperature of a wafer. In FIG. 8, a horizontal axis indicates the reflection factor of a wafer and a vertical axis indicates temperature difference (° C.). A reflection factor indicated by the horizontal axis is changed by changing the thickness of the SiN film 3b of the film formed wafer 3. The reflection factor of the bare wafer 2 is about 0.3. The vertical axis indicates the difference between the peak temperatures of the bare wafer 2 and each film formed wafer 3.

A wide range of reflection factors can be obtained by controlling the thickness of a single layer of the SiN film 3b. In particular, a reflection factor lower than that of the bare wafer 2 (about 0.3) can be controlled with accuracy. As can be seen from FIG. 8, peak temperatures are showing a tendency to increase with an increase in reflection factor. The reflection factor of the film formed wafer 3 shown in FIG. 7 is about 0.1 and its peak temperature is lower than that of the bare wafer 2 by about 2° C. That is to say, a difference in reflection factor has an influence on temperature at lamp anneal time.

As described above, even if an optimum offset value to be added to the intensity of lamp light is set by using the bare wafer the reflection factor of which is different from that of the actual device wafer, it is difficult to properly control the temperature of the device wafer having an area the reflection factor of which is different from that of the bare wafer. In addition, as can be seen from the above-mentioned results, a wafer on which the distribution of reflection factors is the same as that of reflection factors on the device wafer can be made by using an SiN film with appropriate thickness. Furthermore, the reflection factor of the side of the device wafer irradiated with lamp light can be made approximately uniform by forming an SiN film with appropriate thickness outside the device formed area.

First, a method for performing heat treatment by using a device wafer which is wrought by using an SiN film having the same reflection factor as a device formed area as a film formed wafer will be described concretely (first embodiment). Secondly, a method for setting an offset value by using a film formed wafer on which an SiN film is formed in a specific area in place of a bare wafer to perform heat treatment on a device wafer will be described concretely (second embodiment).

The first embodiment will be described first. In the first embodiment, a method for performing heat treatment by using a device wafer which is wrought by using an SiN film as a film formed wafer will be described.

Figure 9:
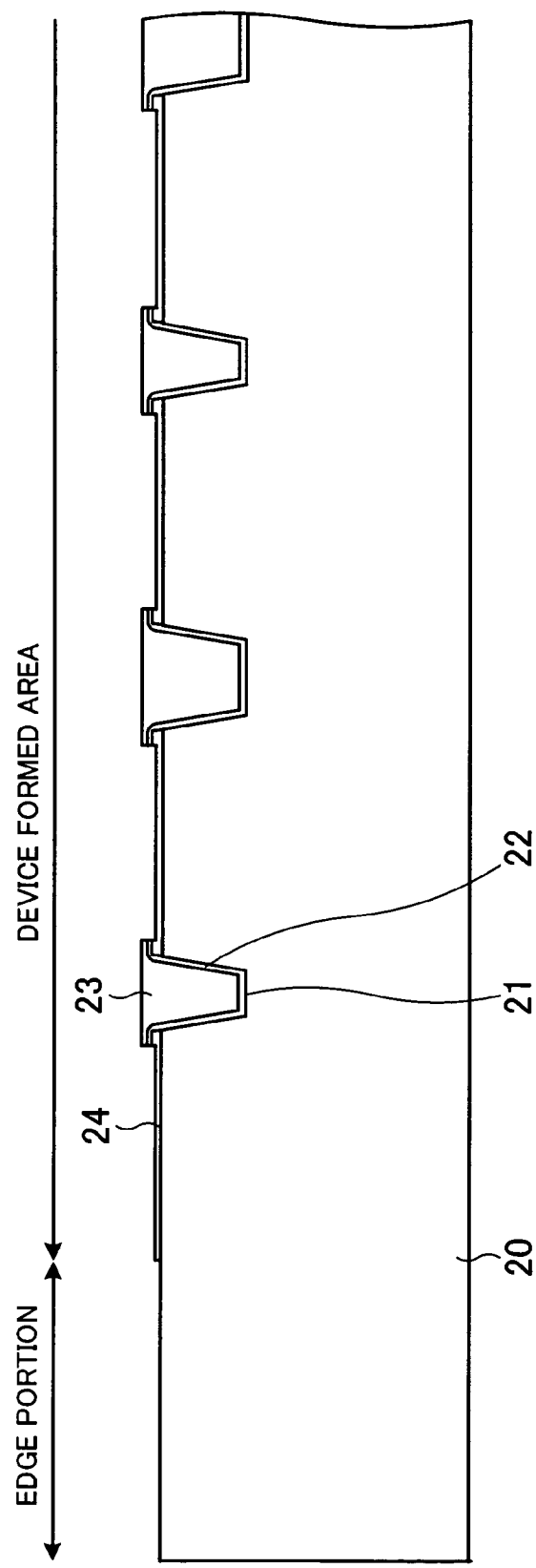
FIG. 9 is a simplified sectional view showing the main portion of a sacrificial oxide formation process performed after the formation of isolation areas and before the formation of well areas.

FIG. 9 is a simplified sectional view showing the main portion of a sacrificial oxide formation process performed after the formation of isolation areas and before the formation of well areas.

A semiconductor device is produced in, for example, the following way. A trench 21 is formed in a wafer 20, a thin oxide 22 with a thickness of about 10 nm is formed by oxidizing the inner wall of the trench 21 by a thermal oxidation method, an $SiO_2$ film 23 is embedded in the trench 21, and the surface of the $SiO_2$ film 23 is flattened by a chemical mechanical polishing (CMP) method. As a result, an STI for isolation is formed. Then the surface of the wafer 20 is oxidized by the thermal oxidation method to form a sacrificial oxide 24 with a thickness of about 10 nm. In this case, the sacrificial oxide 24 on the edge portion of the wafer 20 is removed by, for example, hydrofluoric acid (HF) treatment and an Si surface is exposed in the edge portion.

After the sacrificial oxide 24 is formed, usually ion implantation for forming a well area and ion implantation for forming a channel area are performed. In the first embodiment, however, the average reflection factor of a device formed area on the wafer 20 in which the sacrificial oxide 24 has been formed is measured and the following first through fifth processes are newly added.

Figure 10:
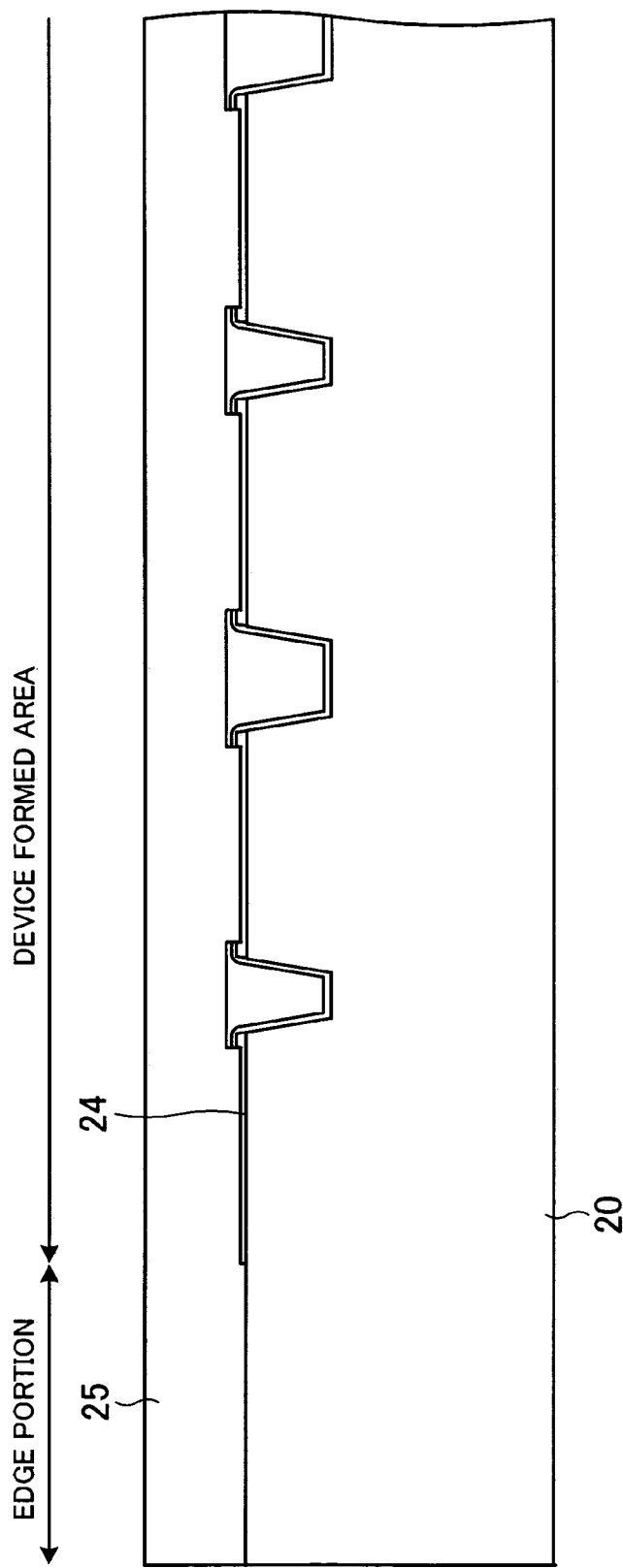
FIG. 10 is a simplified sectional view showing the main portion of a first process.
Figure 11:
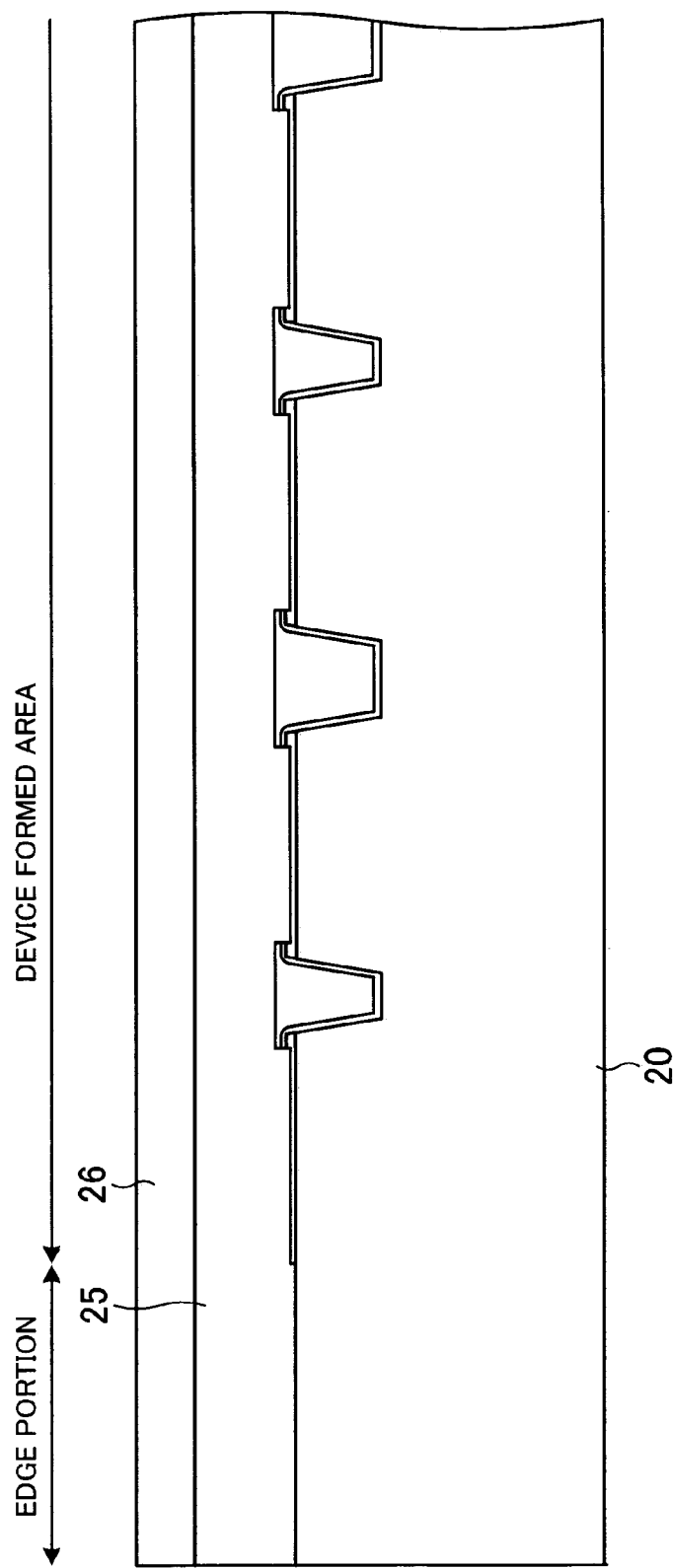
FIG. 11 is a simplified sectional view showing the main portion of a second process.
Figure 12:
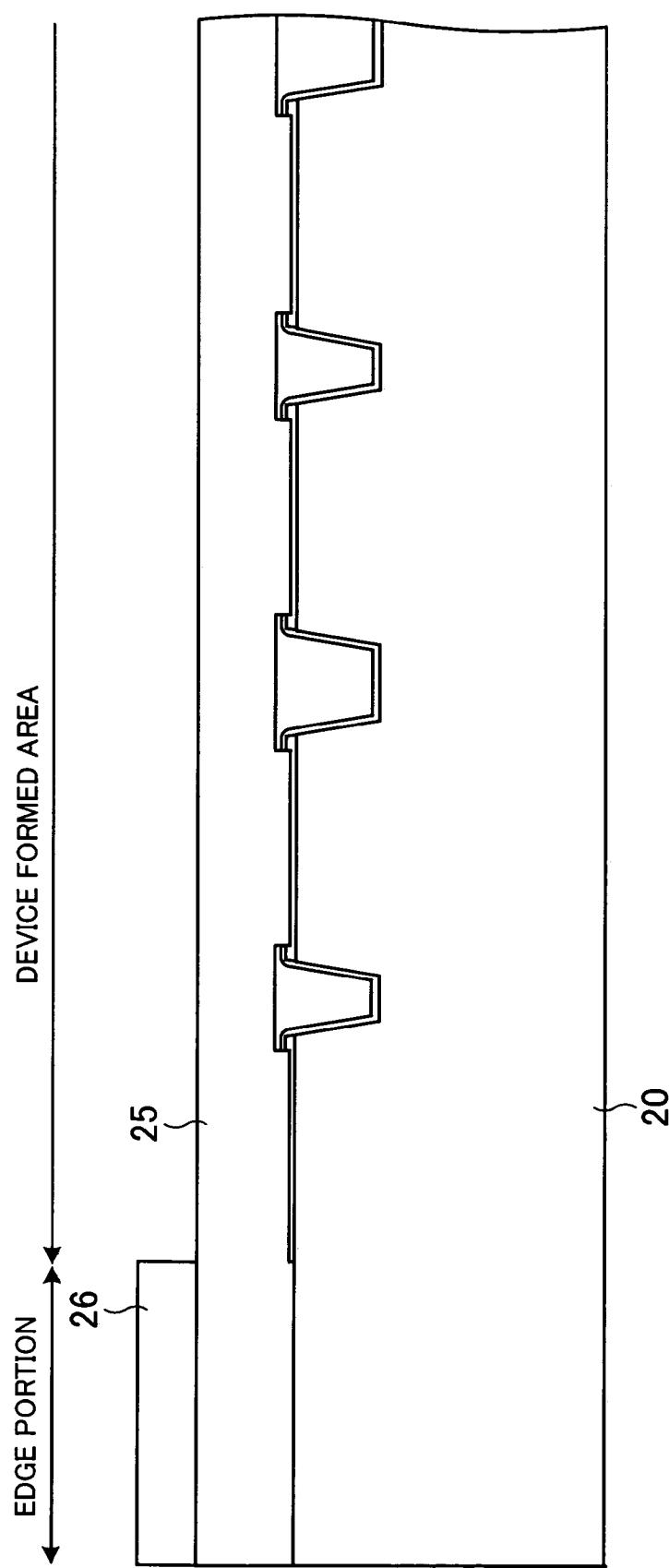
FIG. 12 is a simplified sectional view showing the main portion of a third process.
Figure 13:
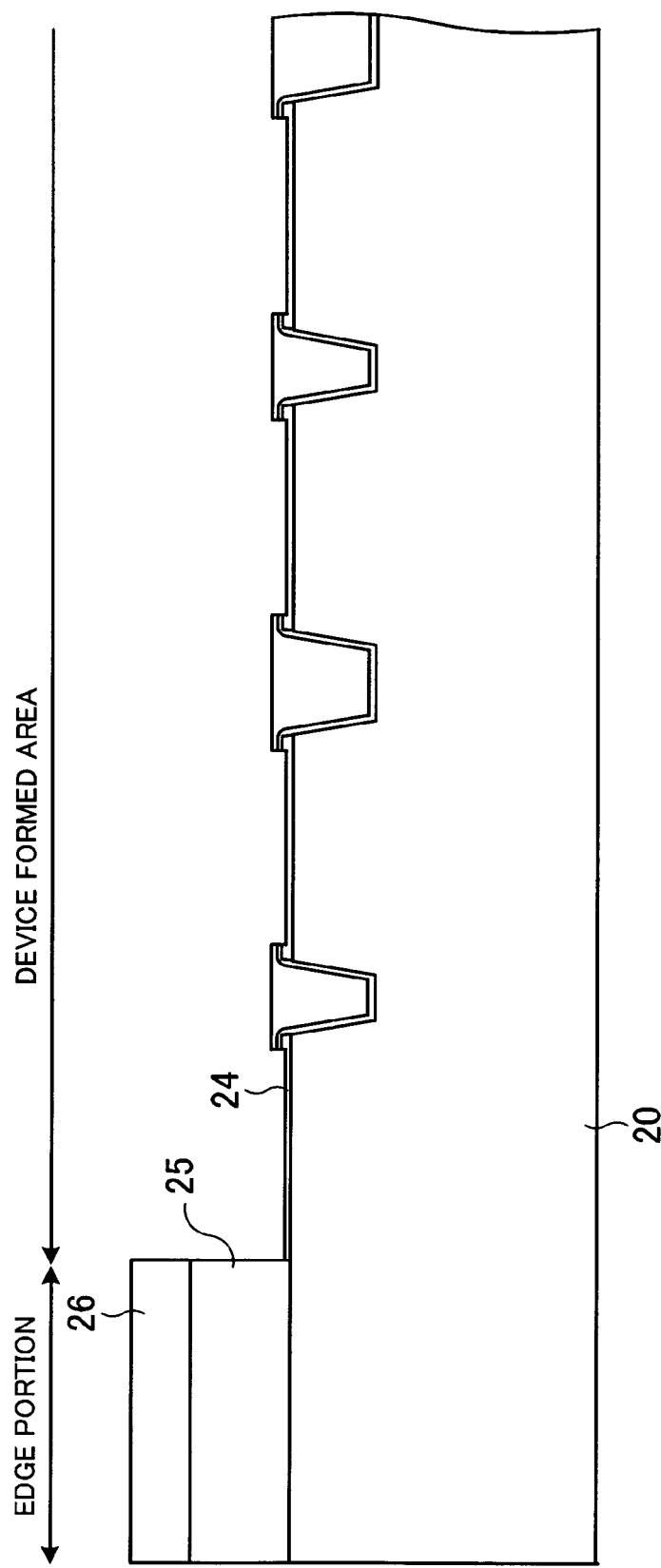
FIG. 13 is a simplified sectional view showing the main portion of a fourth process.
Figure 14:
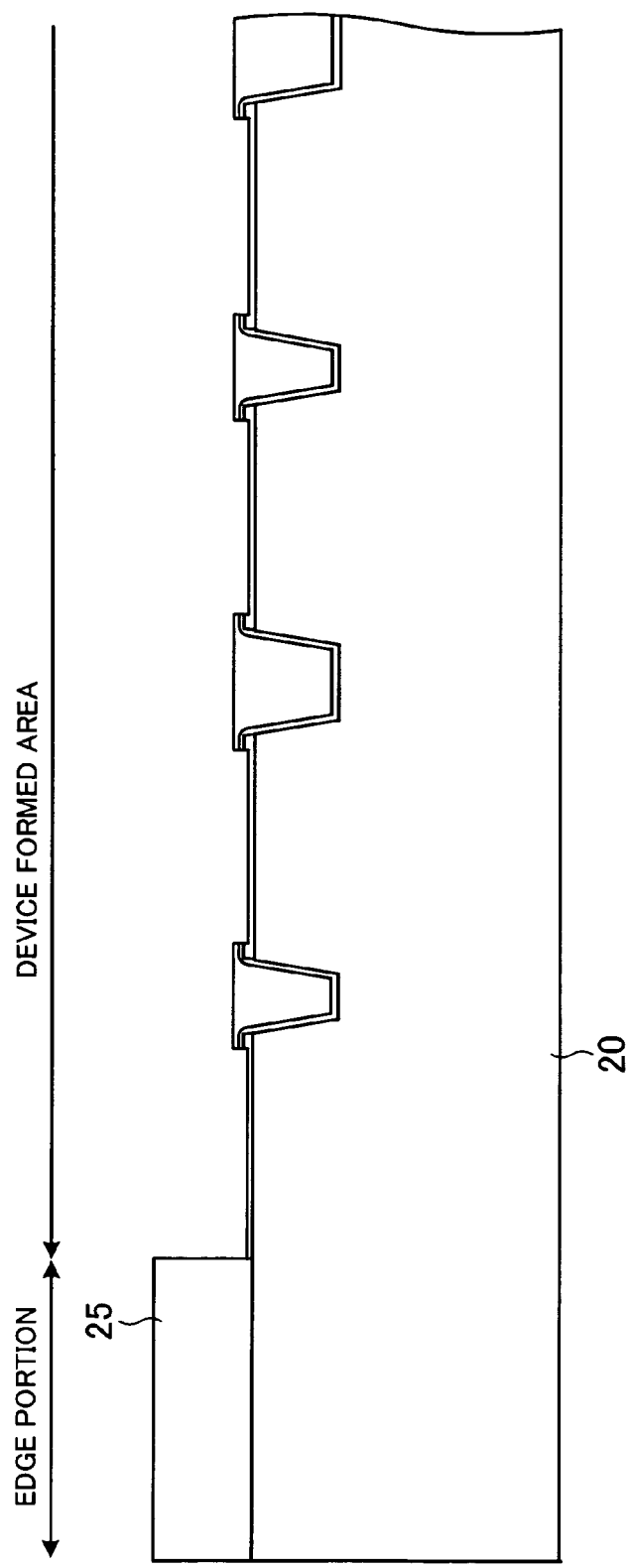
FIG. 14 is a simplified sectional view showing the main portion of a fifth process.
Figure 15:
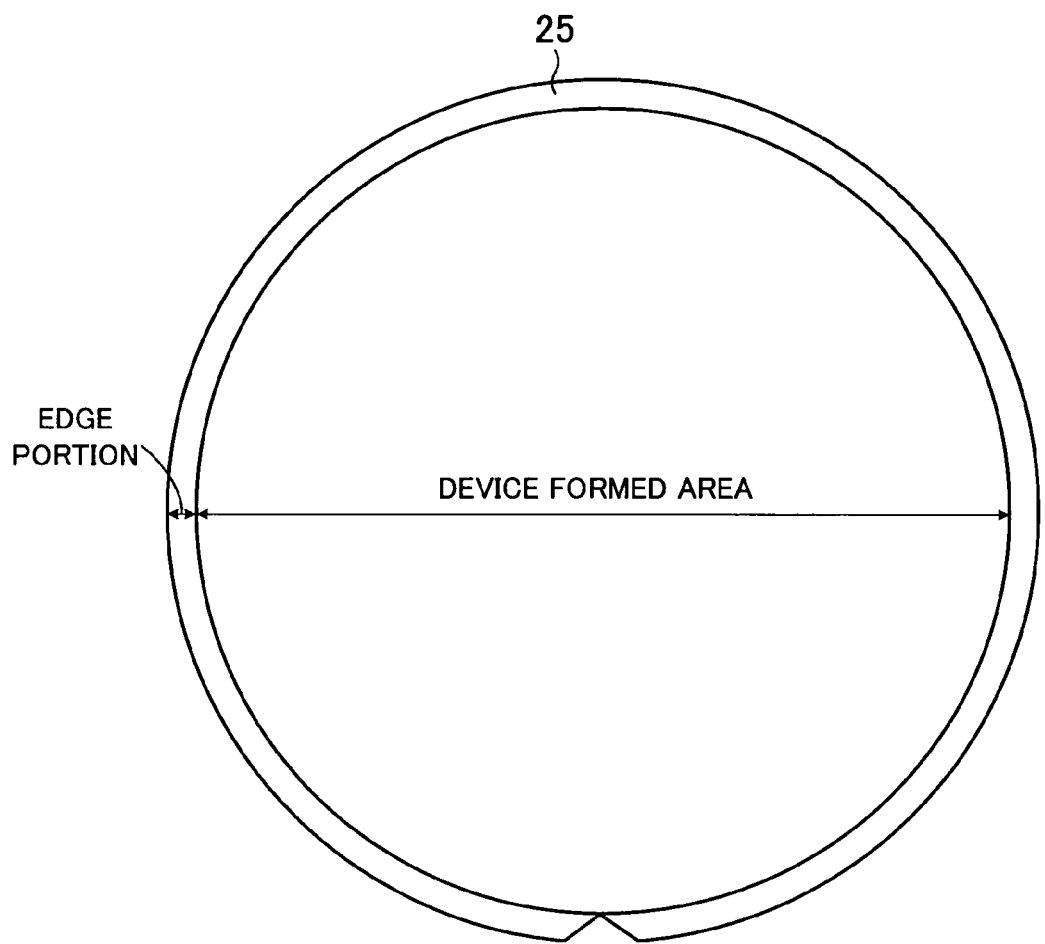
FIG. 15 is a simplified plan showing the main portion of the fifth process.

FIG. 10 is a simplified sectional view showing the main portion of the first process. FIG. 11 is a simplified sectional view showing the main portion of the second process. FIG. 12 is a simplified sectional view showing the main portion of the third process. FIG. 13 is a simplified sectional view showing the main portion of the fourth process. FIG. 14 is a simplified sectional view showing the main portion of the fifth process. FIG. 15 is a simplified plan showing the main portion of the fifth process.

In the first process, as shown in FIG. 10, after the sacrificial oxide 24 is formed, an SiN film 25 with predetermined thickness is formed on the entire surface of the wafer 20 on which the sacrificial oxide 24 is formed by the CVD method at a temperature of, for example, about 700° C.

The thickness of the SiN film 25 is set on the basis of the reflection factor of the wafer 20 measured in advance after the formation of the sacrificial oxide 24. If the average reflection factor of the device formed area on the wafer 20 is, for example, about 0.1, then the thickness of the SiN film 25 formed under the above condition should be set to about 110 nm.

In the subsequent second process, as shown in FIG. 11, the entire surface of the SiN film 25 is coated with a nega-type resist 26 which contains polyhydroxy styrene (PHS) by, for example, a spin coat method.

In the third process, as shown in FIG. 12, the edge portion of the wafer 20 is exposed to light and the nega-type resist 26 is left only outside the device formed area in which the STI is formed.

In the fourth process, as shown in FIG. 13, the exposed SiN film 25 is etched and removed with the nega-type resist 26 left as a mask and with the sacrificial oxide 24 as an etching stopper. This etching is performed by using a gas which contains, for example, $C_xH_yF_z$.

In the last fifth process, as shown in FIG. 14, the nega-type resist 26 left on the SiN film 25 in the edge portion is removed by performing the normal ashing treatment, APM treatment using a mixture of ammonia, hydrogen peroxide, and ultra pure water, and SPM treatment using a mixture of sulfuric acid, hydrogen peroxide, and ultra pure water. The nega-type resist 26 is formed in the edge portion, so particles may remain on a carrier. Therefore, it should be replaced with a clean carrier after the fifth process.

As shown in FIGS. 14 and 15, on a device wafer obtained by performing the above-mentioned first through fifth processes, the SiN film 25 is formed in the edge portion where an Si surface has conventionally been exposed and the structure of the device formed area is the same as the conventional structure. That is to say, if the side of this device wafer on which the device formed area is formed is irradiated with lamp light, the in-plane reflection factors of the wafer are uniform from the center to the edge.

After the above-mentioned device wafer is formed, the following ordinary manufacturing process is performed. Ion implantation for forming a well area, ion implantation for forming a channel area, a spike anneal for activating impurities, gate oxide formation, and so on are performed to form a transistor structure. After the ion implantation, the lamp annealer 10 shown in FIG. 1 is used for performing the spike anneal. In-plane reflection factors on the side of the device wafer irradiated with lamp light are approximately uniform, so in the lamp anneal comparatively uniform in-plane temperature distribution can be obtained by paying attention to a set temperature.

However, it is preferable that before the spike anneal, an optimum offset value to be added to the intensity of lamp light should be set by using a film formed wafer (offset value setting wafer) on the entire surface of which an SiN film is formed on the side irradiated with lamp light. The thickness of the SiN film on the offset value setting wafer should be set on the basis of the average reflection factor of the device formed area. This is the same with the device wafer. The reflection factor of the offset value setting wafer becomes equal to that of the device wafer. Accordingly, the influence of the substrate holder 11 at lamp anneal time is also taken into consideration and a proper offset value can be set compared with the case where the bare wafer is used. As a result, uniform in-plane temperature distribution can be obtained at lamp anneal time.

As stated above, in the first embodiment the device wafer on which the SiN film 25 having the same reflection factor as the device formed area is formed in the edge portion is used as a film formed wafer. By doing so, in-plane reflection factors on the side of the device wafer irradiated with lamp light can be made uniform and uniform in-plane temperature distribution can be obtained.

In the first embodiment, before the spike anneal performed after the formation of the sacrificial oxide 24, in-plane reflection factors on the side of the device wafer irradiated with lamp light are made uniform by using the SiN film 25. The reason for this is that the SiN film 25 can be formed most easily at this stage and that making in-plane temperature distribution uniform is very effective. That is to say, if the SiN film 25 is formed in the edge portion at this stage, the sacrificial oxide 24 can be used as an etching stopper and be removed later by HF treatment or the like. Moreover, the lamp anneal after the ion implantation has a great influence on a profile of the concentration of the impurities implanted and the activation rate. Therefore, if in-plane temperature distribution can be made uniform at this stage, there are only small variations in the characteristics of semiconductor devices and high-quality semiconductor devices can be manufactured. However, a device wafer having the same structure may be formed before another lamp anneal except at this stage.

The second embodiment will now be described. In the second embodiment, a method for setting an offset value before performing a lamp anneal on a device wafer by using an offset value setting wafer on which an SiN film is formed partially in a specific area as a film formed wafer will be described.

Figure 16:
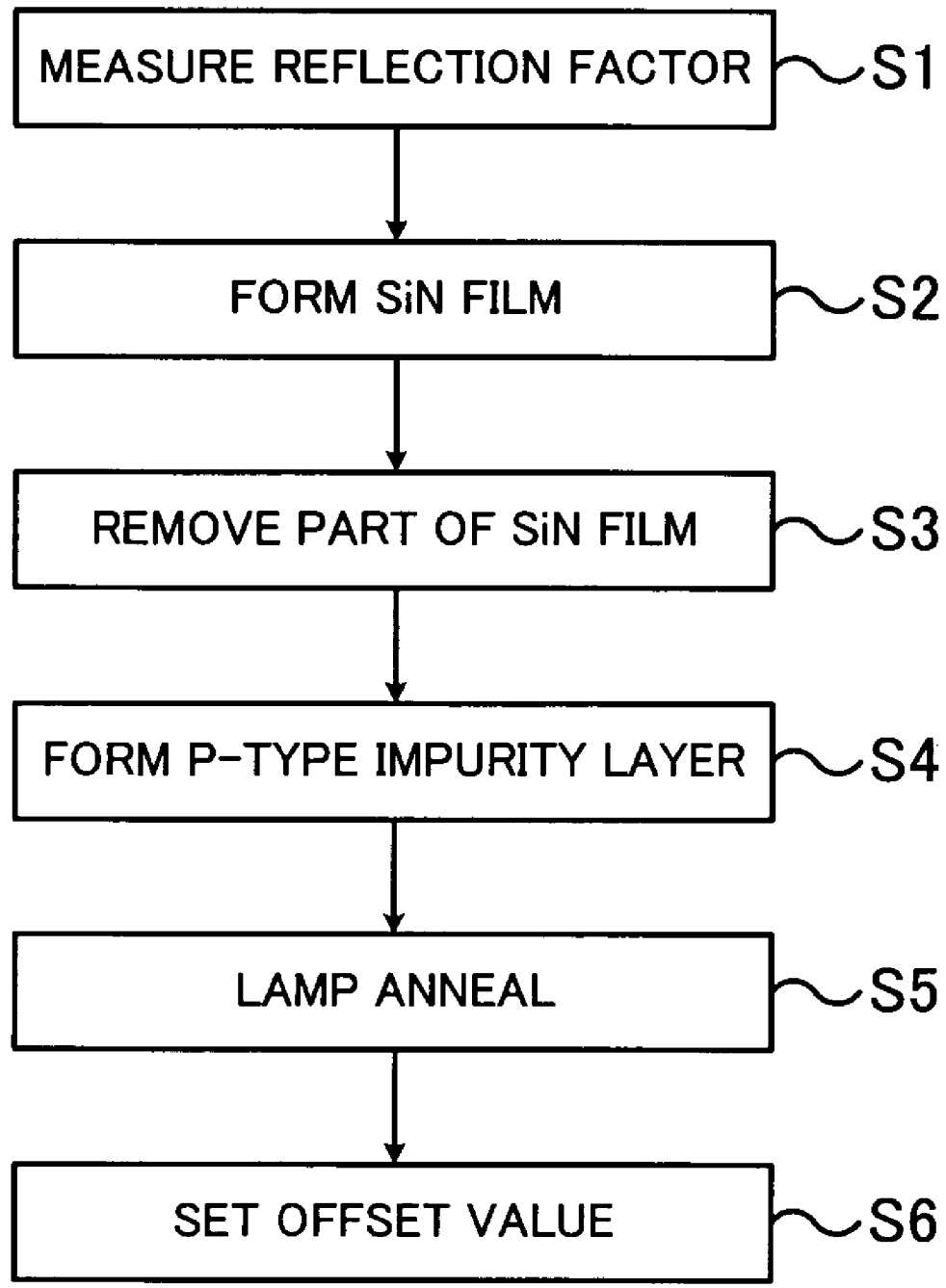
FIG. 16 is a view showing the flow of setting an offset value.
Figure 17:
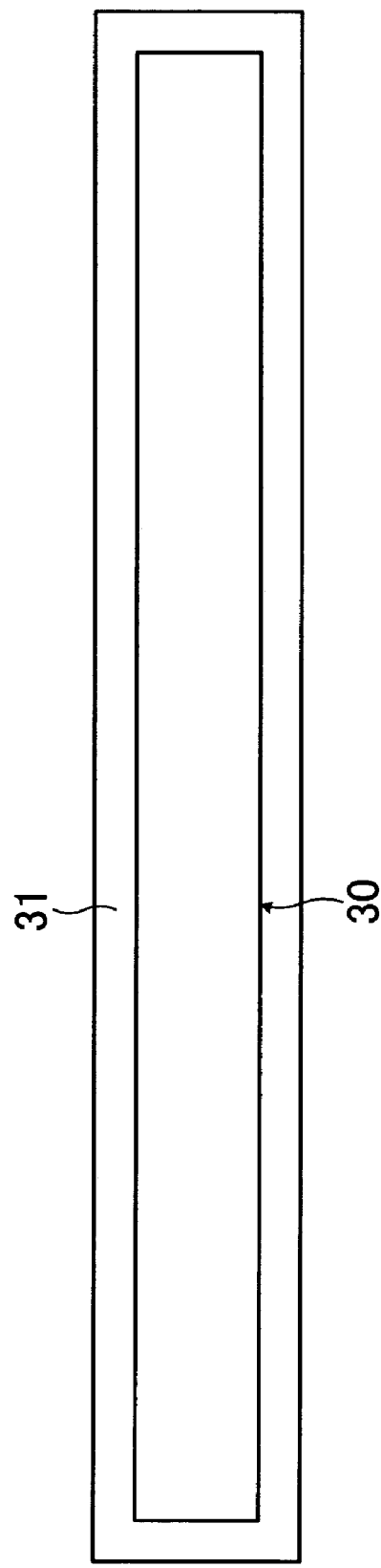
FIG. 17 is a simplified sectional view showing an SiN film formation process.
Figure 18:
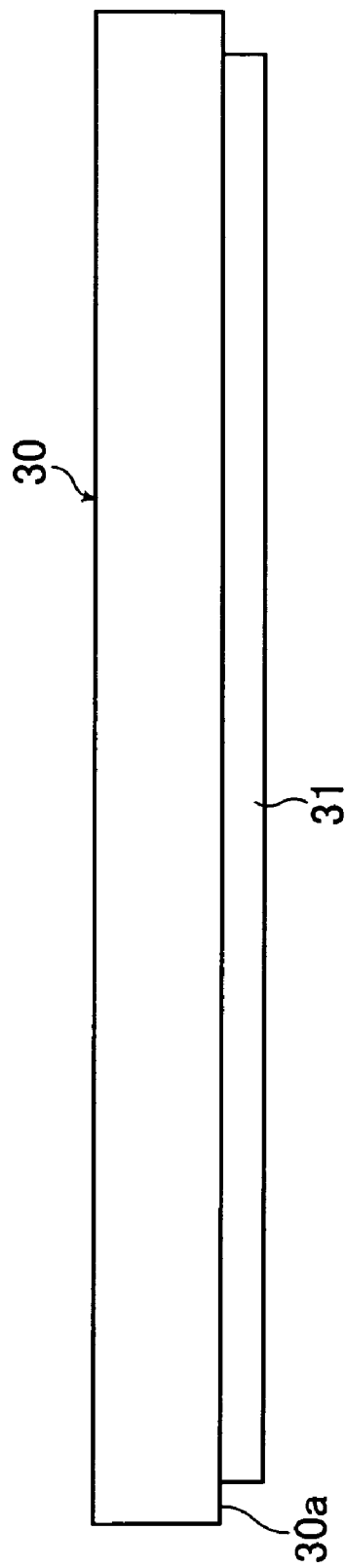
FIG. 18 is a simplified sectional view showing the process of removing part of the SiN film.
Figure 19:
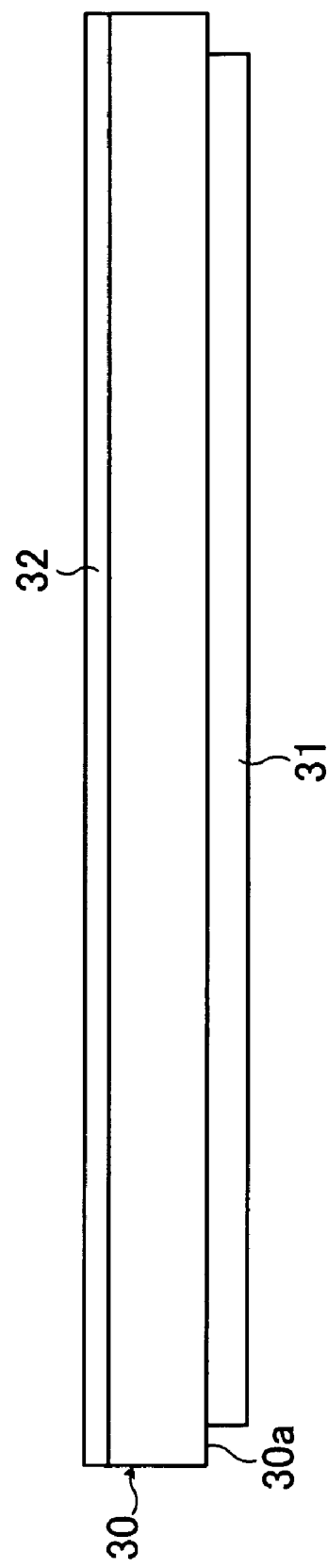
FIG. 19 is a simplified sectional view showing an ion implantation process.
Figure 20:
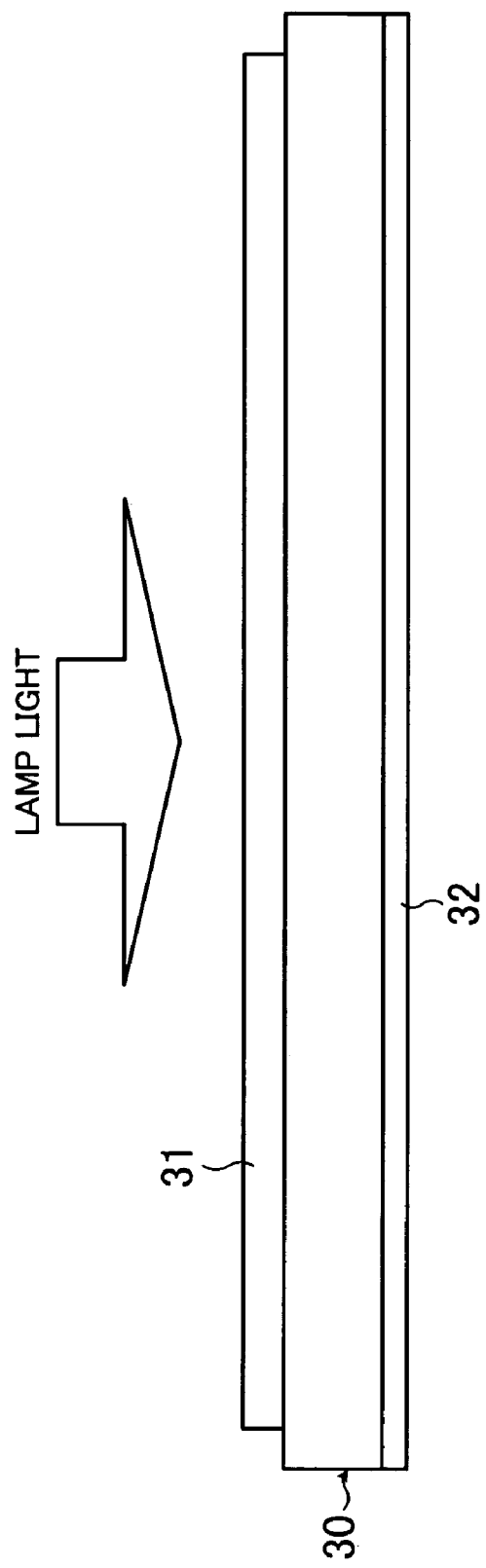
FIG. 20 is a simplified sectional view showing a lamp anneal process.

FIG. 16 is a view showing the flow of setting an offset value. FIGS. 17 through 20 are simplified sectional views showing the process of forming an offset value setting wafer. FIG. 17 is a simplified sectional view showing an SiN film formation process. FIG. 18 is a simplified sectional view showing the process of removing part of the SiN film. FIG. 19 is a simplified sectional view showing an ion implantation process. FIG. 20 is a simplified sectional view showing a lamp anneal process.

Before the formation of an offset value setting wafer, the average reflection factor of a device wafer on which a lamp anneal is to be performed is measured first (step S1).

As shown in FIG. 17, to form an offset value setting wafer, an SiN film 31 with predetermined thickness is formed on all sides of a wafer 30 by the CVD method (step S2). As described above, the thickness of the SiN film 31 is set on the basis of the average reflection factor of a device formed area on the device wafer on which a lamp anneal is to be performed. If the average reflection factor of the device formed area is, for example, about 0.1, then the SiN film 31 with a thickness of about 110 nm should be formed at a temperature of about 700° C.

As shown in FIG. 18, of the SiN film 31 formed on all sides of the wafer 30, the SiN film 31 on the top (in the case of FIG. 18) of the wafer 30, on the side of the wafer 30, and on the bottom (in the case of FIG. 18) in an edge portion 30a of the wafer 30 is removed (step S3).

In step S3, an HF solution, for example, can be used for removing the SiN film 31. In this case, at the same time that an HF solution of high concentration (60%) which can dissolve the SiN film 31 is being sprayed on the top of the wafer 30 on all sides of which the SiN film 31 is formed by the use of a spin processor (SEZ203 manufactured by SEZ Japan Inc.), the wafer 30 is rotated at 500 rpm. Nitrogen ($N_2$) gas is blown on the bottom of the wafer 30 where an HF solution is not sprayed at a flow rate of 50 NL/min. As a result, the SiN film 31 on the top of the wafer is removed. In addition, a portion of the HF solution flows to the bottom of the wafer 30, so the SiN film 31 on the side of the wafer 30 and on the bottom in the edge portion 30a of the wafer 30 is removed. In this example, the SiN film 31 on the bottom of the wafer 30 with a width from the edge of about 1.5 mm is removed.

The width of the edge portion 30a is set with the width of an edge portion of the device wafer on which a lamp anneal is to be performed where an Si surface is exposed (or the size of the device formed area) taken into consideration. That is to say, the SiN film 31 is removed so that the device formed area on the device wafer will correspond to an area on the wafer 30 where the SiN film 31 is left. The width of the edge portion 30a where the SiN film 31 is removed can be controlled by controlling the number of revolutions made by the wafer 30 at the time of spraying an HF solution and the flow rate of $N_2$ gas blown. For example, if the number of revolutions made by the wafer 30 is decreased and the flowrate of $N_2$ gas blown is decreased, then an HF solution tends to flow to the bottom of the wafer 30.

As shown in FIG. 19, to measure sheet resistance values, a p-type impurity layer 32 is formed in the surface of the wafer 30 from which the SiN film 31 is completely removed by implanting p-type impurity ions (step S4). In this case, the p-type impurity layer 32 is formed by implanting, for example, $BF_2^+$ ions at an acceleration energy of about 20 keV with a dosage of about $5\times10^{15}$ $cm^{-2}$. By performing step S4, the offset value setting wafer in one surface of which the p-type impurity layer 32 is formed and on the other surface of which the SiN film 31 is formed except in the edge portion 30a is formed.

As shown in FIG. 20, then the offset value setting wafer is placed on the substrate holder 11 in the chamber of the lamp annealer 10 shown in FIG. 1 so that the SiN film 31 side will be irradiated with lamp light at lamp anneal time. A lamp anneal is performed on the offset value setting wafer (step S5).

After the lamp anneal, the sheet resistance values of the offset value setting wafer are measured to estimate in-plane temperature distribution. An optimum offset value to be added to the intensity of lamp light in each zone in the lamp annealer 10 at the time of annealing the device wafer is set on the basis of the in-plane temperature distribution (step S6). For example, an offset value is set so that the amount of control given to the intensity of lamp light in a zone with which the edge portion the temperature of which tends to decrease at the time of annealing the device wafer is directly irradiated will be larger than the amount of control given to the intensity of lamp light in another zone.

Results obtained by performing a lamp anneal on the device wafer by the use of an offset value set in the above-mentioned way are as follows.

Figure 21:
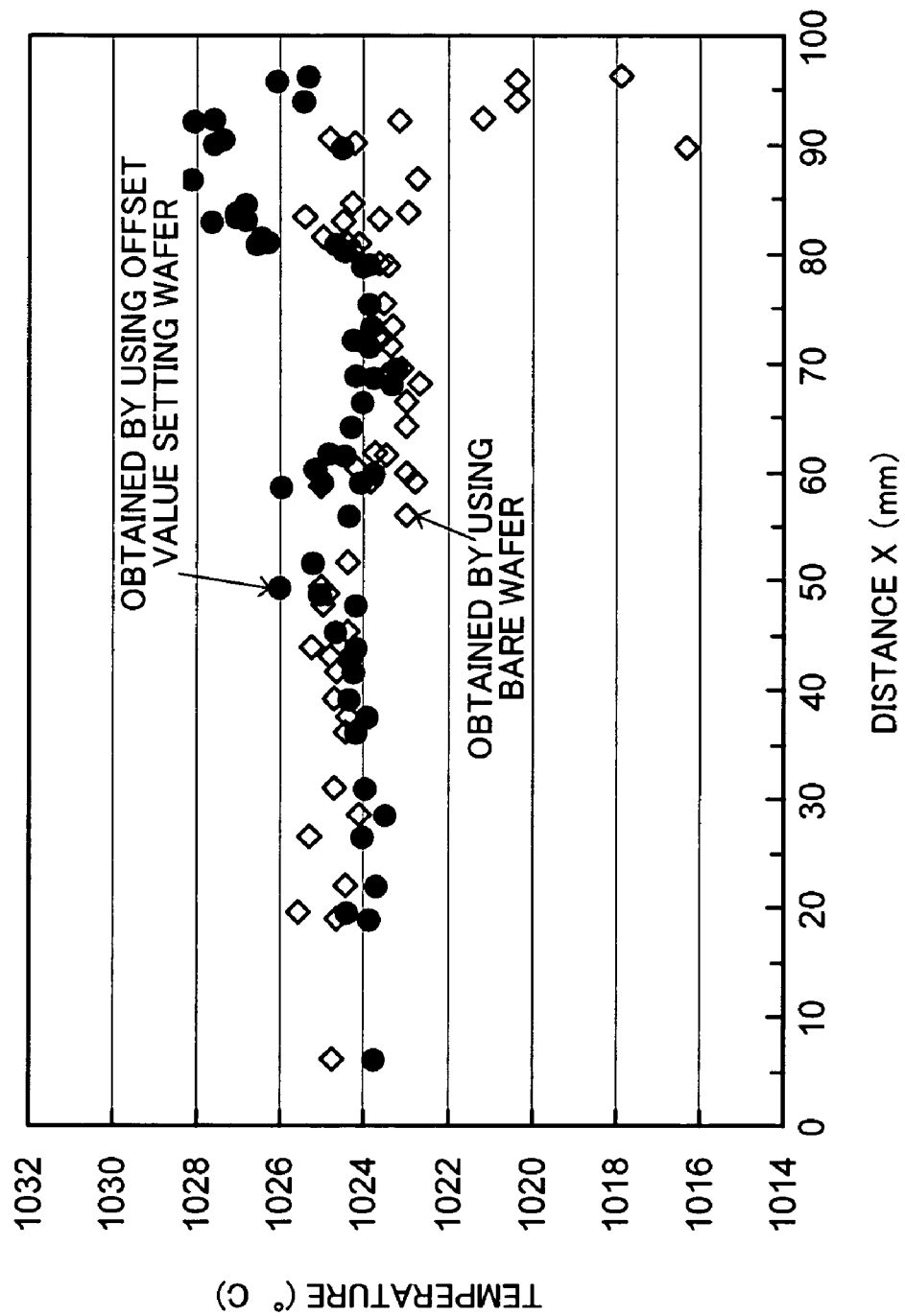
FIG. 21 shows an example of in-plane temperature distribution on a device wafer on which nMOS patterns are formed.
Figure 22:
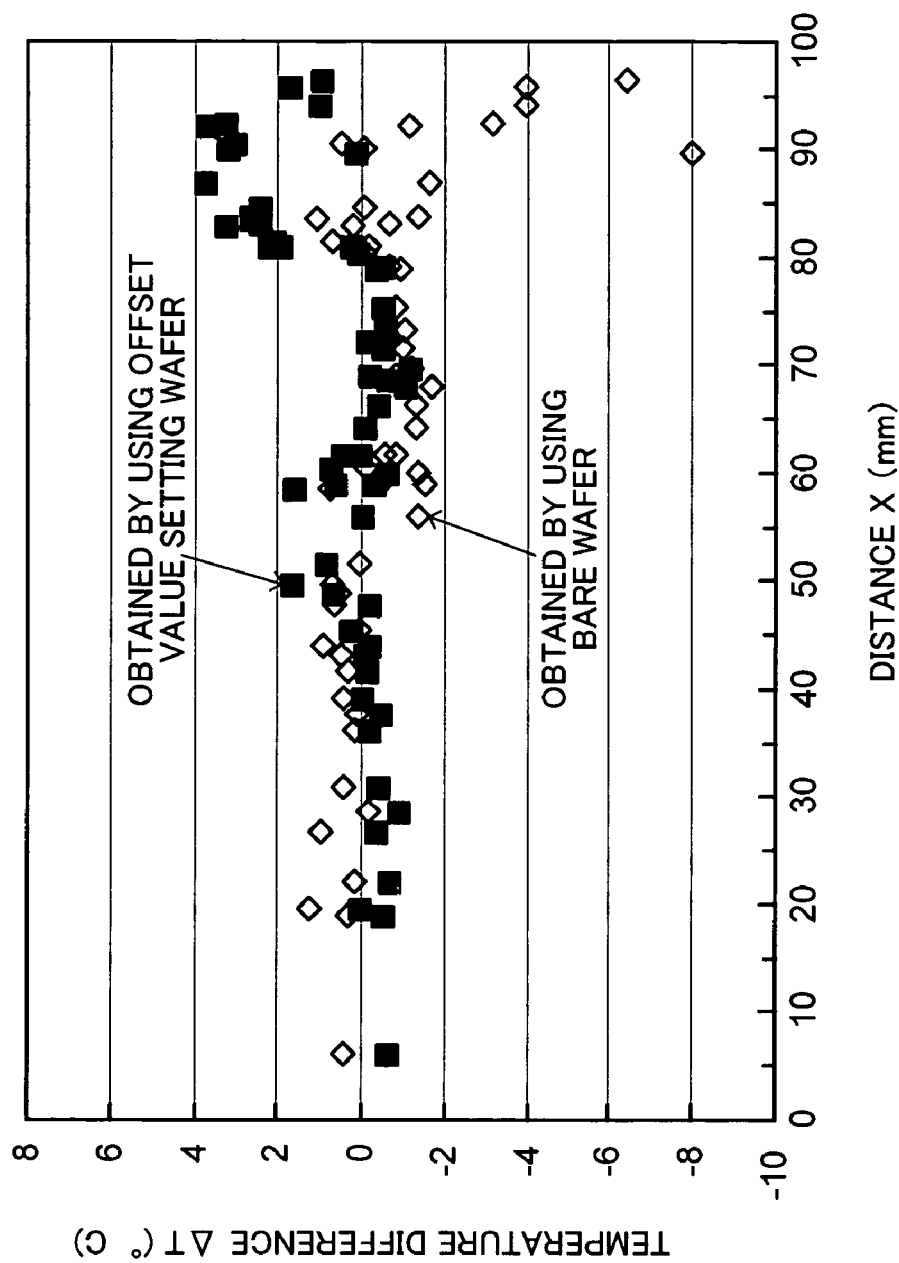
FIG. 22 shows an example of the difference between the average value of temperatures in areas within a distance of about 65 mm from the center of the device wafer and a temperature in each area on the device wafer.

FIG. 21 shows an example of in-plane temperature distribution on the device wafer on which nMOS patterns are formed. In FIG. 21, a horizontal axis indicates distance X (mm) between each position on the wafer and its center and a vertical axis indicates a temperature (° C.) in each area. FIG. 22 shows an example of the difference between the average value of temperatures in areas within a distance of about 65 mm from the center of the device wafer and a temperature in each area on the device wafer. In FIG. 22, a horizontal axis indicates distance X (mm) between each position on the wafer and its center and a vertical axis indicates a temperature difference $\Delta T$ (° C.). In FIGS. 21 and 22, in-plane temperature distribution obtained by setting an offset value by the use of a bare wafer as before and by performing a lamp anneal on the device wafer on which the nMOS patterns are formed is also shown for comparison.

As shown in FIG. 21, if an offset value is set by using the bare wafer, a variation in temperature is great in an area distance X from which to the center is greater than 80 mm. Temperature drops significantly especially in an area distance X from which to the center is greater than 90 mm. On the other hand, as can be seen from FIG. 21, if an optimum offset value is set by using the offset value setting wafer on which the SiN film 31 is formed in the area corresponding to the device formed area on the device wafer, a drop in temperature in the above areas is improved significantly.

As shown in FIG. 22, if the offset value setting wafer is used, the difference between the average value of comparatively uniform temperatures in areas within a distance of about 65 mm from the center of the device wafer and temperatures in the above areas also becomes small compared with the case where the bare wafer is used.

If the offset value setting wafer is used, variations in temperature in areas from the center to edge portion of the device wafer are within a range of about 6° C. and uniform in-plane temperature distribution can be obtained at lamp anneal time. In-plane temperature distribution on the device wafer is made uniform, so the thermal budget of a semiconductor device formed in the central portion can be made closer to the thermal budget of a semiconductor device formed in an area near the edge portion. This makes in-plane variations of a profile of the concentration of impurities implanted and the activation rate small. As a result, a variation in the value of the parasitic resistance of each semiconductor device can be made small.

Figure 23:
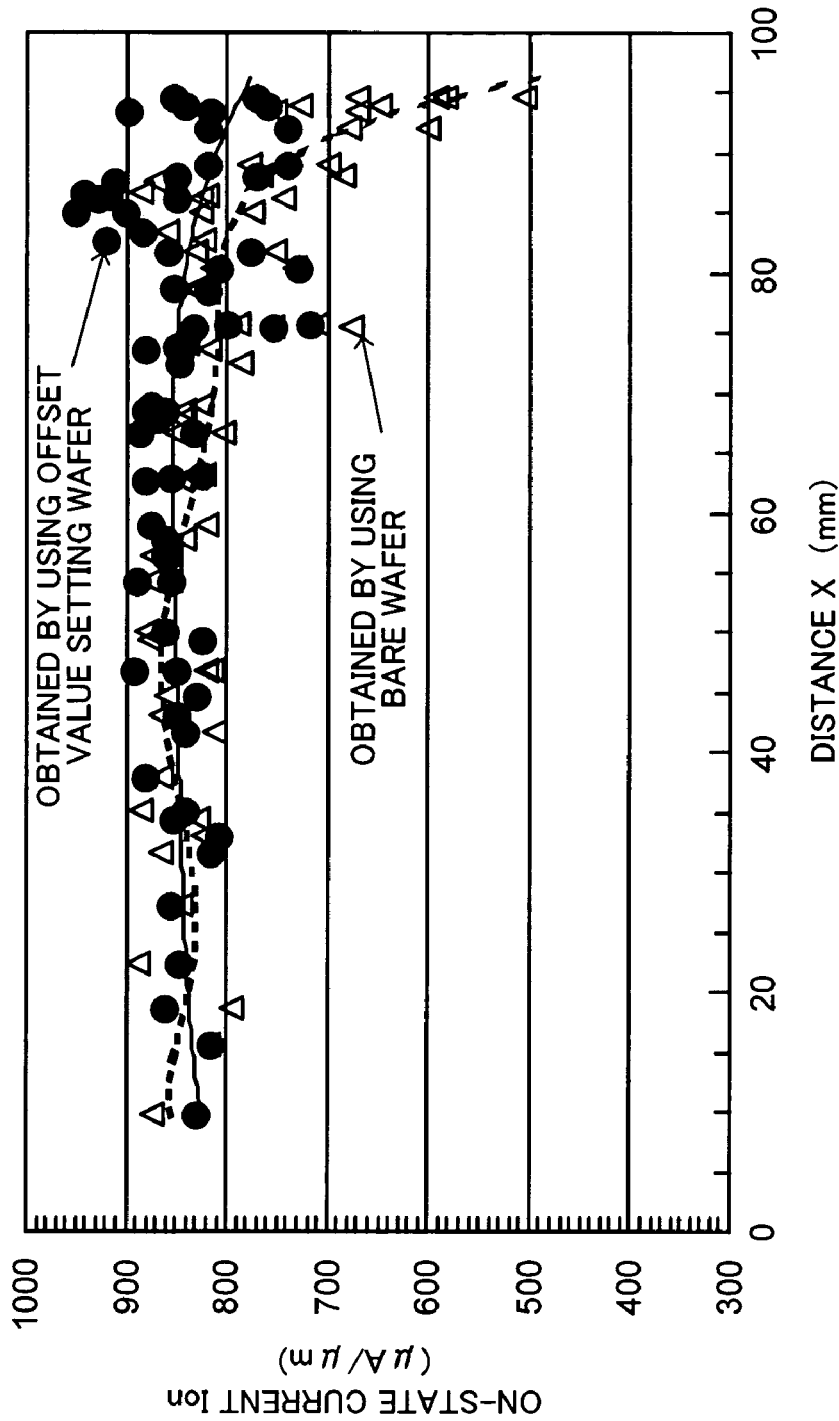
FIG. 23 shows an example of in-plane nMOS ON-state current distribution on the device wafer.
Figure 24:
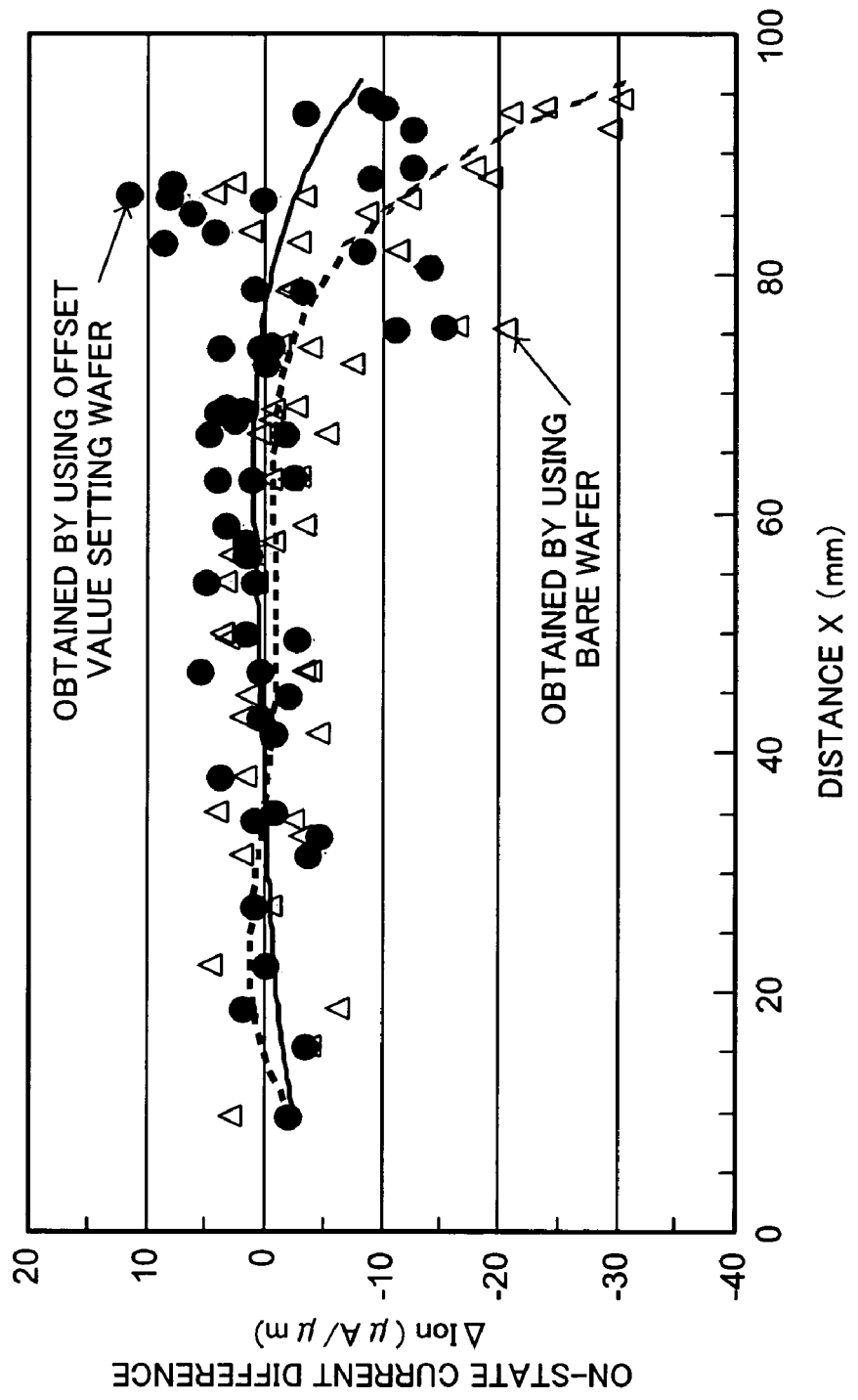
FIG. 24 shows an example of the difference between the average value of ON-state currents in areas within a distance of about 65 mm from the center of the device wafer and an ON-state current in each area on the device wafer.

FIG. 23 shows an example of in-plane nMOS ON-state current distribution on the device wafer. In FIG. 23, a horizontal axis indicates distance X (mm) between each area on the wafer and its center and a vertical axis indicates ON-state current $I_{on}$ ($\mu A/\mu m$) in each nMOS. FIG. 24 shows an example of the difference between the average value of ON-state currents in areas within a distance of about 65 mm from the center of the device wafer and an ON-state current in each area on the device wafer. In FIG. 24, a horizontal axis indicates distance X (mm) between each area on the wafer and its center and a vertical axis indicates the difference ($\mu A/\mu m$) in ON-state current $I_{on}$ between nMOSes. In FIGS. 23 and 24, in-plane nMOS ON-state current distribution obtained by setting an offset value by the use of a bare wafer as before and by performing a lamp anneal on the device wafer are formed is also shown for comparison.

As shown in FIG. 23, if an offset value is set by using the bare wafer, a variation in nMOS ON-state current becomes great in an area about 80 mm distant from the center of the device wafer where a variation in temperature becomes great at lamp anneal time. An ON-state current reduces significantly in an area more than 90 mm distant from the center of the device wafer. On the other hand, if an offset value is set by using the offset value setting wafer, an ON-state current in an nMOS formed in an area which is more than about 80 mm distant from the center of the device wafer and which is on this side of the edge portion is significantly improved compared with the case where the bare wafer is used for setting an offset value.

Moreover, as shown in FIG. 24, if the offset value setting wafer is used, the difference between the average value of comparatively uniform ON-state currents in areas within a distance of about 65 mm from the center of the device wafer and an ON-state current in an area near the edge portion also becomes small compared with the case where the bare wafer is used. For example, in an nMOS formed in an area which is more than 95 mm distant from the center of the device wafer and which is on this side of the edge portion, the amount of a drop in ON-state current can be reduced by about 15 percent compared with conventional cases. As described above, by making in-plane temperature distribution on the device wafer uniform, in-plane variations in the characteristics of semiconductor devices on the device wafer can be made small.

As stated above, in the second embodiment, the offset value setting wafer on which an Si surface is exposed in the edge portion 30a on the side irradiated with lamp light and on which the SiN film 31 is formed except in the edge portion 30a on the side irradiated with lamp light is used as a film formed wafer for setting an offset value to-be added to the intensity of lamp light in each zone in the lamp annealer. The reflection factor of the offset value setting wafer can be made equal to that of the device wafer by forming the SiN film 31 with predetermined thickness. Accordingly, a proper offset value can be calculated compared with the case where an offset value is calculated by using the bare wafer. As a result, in-plane temperature distribution on the device wafer can be made uniform at lamp anneal time.

In addition, in the second embodiment, the offset value setting wafer the structure of which corresponds to that of the device wafer at the lamp anneal stage is used for setting a proper offset value. Accordingly, there is no need to work the device wafer. As a result, high-quality semiconductor devices can be manufactured without changing the manufacturing process and lowering productivity.

The same effect that is obtained in the second embodiment is gained by using the device wafer according to the first embodiment described above.

As has been described in the foregoing, in the present invention, by forming the SiN film with proper thickness in the edge portion on the device wafer and making the reflection factor of the edge portion equal to the average reflection factor of the device formed area, reflection factors on the entire surface of the device wafer are made uniform. By adding the process of forming the SiN film in the edge portion on the device wafer to the usual manufacturing process of semiconductor devices, in-plane temperature distribution on the device wafer can be made uniform at lamp anneal time. As a result, in-plane variations in the characteristics of semiconductor devices on the device wafer can be made small and high-quality semiconductor devices can be manufactured.

Moreover, in the present invention, the offset value setting wafer on which the SiN film with proper thickness is formed in the area corresponding to the device formed area is used for setting an offset value to be added to the intensity of lamp light in each zone in the lamp annealer before a lamp anneal is performed on the device wafer. As a result, in-plane temperature distribution on the device wafer can be made uniform at lamp anneal time without changing the manufacturing process of semiconductor devices. Therefore, in-plane variations in the characteristics of semiconductor devices on the device wafer can be made small and high-quality semiconductor devices can be manufactured.

Polycrystalline silicon and silicon oxide which occupy a large portion of the device formed area may be used in place of the above-mentioned SiN film. In this case, they are layered according to reflection factors. However, if the complexity of the formation of such a structure, influence on another process, and so on are taken into consideration, an SiN film which is used as a single layer and the reflection factor of which can easily be controlled is preferable.

In the present invention, when heat treatment is performed by light irradiation in the process of manufacturing semiconductor devices, a wafer on which a film having the same reflection factor as a device formed area where patterns for the semiconductor devices are formed is formed in a specific area on a side directly irradiated with light is used. Accordingly, reflection factors in areas on the surface of the device wafer irradiated with light can be made uniform and a wafer like the device wafer on which areas having different reflection factors exist can be formed. That is to say, uniform temperature distribution can be obtained at the time of performing heat treatment on the device wafer. As a result, in-plane variations in the characteristics of semiconductor devices on the device wafer can be made small and high-quality semiconductor devices can be manufactured.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device manufacturing method including the process of performing heat treatment by light irradiation and using a film formed wafer where a film having the same reflection factor as a device formed area on a device wafer in which semiconductor devices are to be formed is formed in a specific area on a surface directly irradiated with light at the time of performing the heat treatment by irradiating the device formed area on the device wafer with the light.

2. The semiconductor device manufacturing method according to claim 1, wherein:
   the film is silicon nitride; and
   the thickness of the silicon nitride is controlled so that the reflection factor of the film will be equal to the reflection factor of the device formed area.

3. The semiconductor device manufacturing method according to claim 1, wherein the reflection factor of the device formed area is the average reflection factor of the device formed area.

4. The semiconductor device manufacturing method according to claim 1, wherein the film formed wafer is made by forming the film in an edge portion outside the device formed area on the device wafer.

5. The semiconductor device manufacturing method according to claim 4, wherein the film formed wafer is made by the steps of:
   forming the film on the entire surface of the device wafer on a side on which the device formed area is formed;
   forming a resist in the edge portion on the device wafer in which the film is formed; and
   performing etching with the resist as a mask and removing the film in the device formed area.

6. The semiconductor device manufacturing method according to claim 1, wherein the film formed wafer is fabricated by forming the film in an area corresponding to the device formed area on the device wafer on the side directly irradiated with the light.

7. The semiconductor device manufacturing method according to claim 1, wherein the film formed wafer is made by forming the film on the whole of the surface directly irradiated with the light.

8. The semiconductor device manufacturing method according to claim 1, wherein when heat treatment is performed by light irradiation, one surface of a wafer supported by a holder is directly irradiated with the light and radiant light from the wafer is reflected from a reflecting plate located on the side of other surface of the wafer onto the wafer.

9. A method for manufacturing a wafer used for performing heat treatment by light irradiation, the method comprising the steps of:
   forming a film having the same reflection factor as a device formed area where semiconductor devices are to be formed on an entire surface on a side on which the device formed area is formed;
   forming a resist in an edge portion; and
   performing etching with the resist as a mask and removing the film in the device formed area.

10. The method according to claim 9, wherein:
    the film is silicon nitride; and
    the thickness of the silicon nitride is controlled so that the reflection factor of the film will be equal to the reflection factor of the device formed area.

11. The method according to claim 9, wherein the reflection factor of the device formed area is the average reflection factor of the device formed area.

12. A method for fabricating a wafer used for performing heat treatment by light irradiation, the method comprising the steps of:
    forming a film having the same reflection factor as a device formed area where semiconductor devices are to be formed on all surfaces; and
    removing the film formed on one surface and the film formed in an edge portion on other surface.

13. The method according to claim 12, wherein:
the film is silicon nitride; and
the thickness of the silicon nitride is controlled so that the reflection factor of the film will be equal to the reflection factor of the device formed area.

14. The method according to claim 12, wherein the reflection factor of the device formed area is the average reflection factor of the device formed area.

15. The method according to claim 12, wherein the film formed on the one surface and the film formed in the edge portion on the other surface are removed by spraying a chemical which can dissolve the film on the one surface and by making the chemical flow from the one surface to the edge portion on the other surface of the wafer.

16. A method for forming semiconductor devices, the method comprising the processes of:

forming a protective film on the surface of a semiconductor wafer having a device formed area and a specific area;

removing the protective film formed in the specific area;

forming a reflecting film having a predetermined reflection factor so that the reflecting film will cover the surface of the semiconductor wafer; and removing the reflecting film formed in the device formed area.

* * * * *